United States Patent
Park et al.

(10) Patent No.: US 12,068,369 B2
(45) Date of Patent: Aug. 20, 2024

(54) SEMICONDUCTOR DEVICES AND METHOD OF MANUFACTURING THE SAME

(71) Applicant: Samsung Electronics Co., Ltd., Suwon-si (KR)

(72) Inventors: Jongsoon Park, Hwaseong-si (KR); Jongchul Park, Seoul (KR); Bokyoung Lee, Hwaseong-si (KR); Jeongyun Lee, Yongin-si (KR); Hyunggoo Lee, Hwaseong-si (KR); Yeondo Jung, Hwaseong-si (KR); Haegeon Jung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/348,904

(22) Filed: Jul. 7, 2023

(65) Prior Publication Data

US 2023/0352527 A1  Nov. 2, 2023

Related U.S. Application Data

(62) Division of application No. 17/324,610, filed on May 19, 2021, now Pat. No. 11,735,627.

(30) Foreign Application Priority Data

Sep. 28, 2020  (KR) .................. 10-2020-0125674

(51) Int. Cl.
*H01L 29/06* (2006.01)
*H01L 27/088* (2006.01)
(Continued)

(52) U.S. Cl.
CPC ........ *H01L 29/0657* (2013.01); *H01L 27/088* (2013.01); *H01L 29/42392* (2013.01); *H01L 29/78696* (2013.01)

(58) Field of Classification Search
CPC ............... H01L 29/0657; H01L 27/088; H01L 29/42392; H01L 29/78696;
(Continued)

(56) References Cited

U.S. PATENT DOCUMENTS 8,753,940 B1  6/2014  Wei et al.
8,987,836 B2  3/2015  Kim et al.
(Continued)

OTHER PUBLICATIONS

Office Action for German Application No. 10 2021 118 453.3 dated Feb. 6, 2024 and English translation.

*Primary Examiner* — Changhyun Yi
(74) *Attorney, Agent, or Firm* — Harness, Dickey & Pierce, P.L.C.

(57) ABSTRACT

A semiconductor device includes a device isolation layer on a substrate; pattern groups including fin patterns extending in a first direction; and gate structures extending in a second direction to intersect the fin patterns. A first pattern group, among the pattern groups, may include first fin patterns. At least a portion of the first fin patterns may be arranged with a first pitch in the second direction. The first pattern group may include a first planar portion extending from a first recess portion. A central axis of the first recess portion may be spaced apart from a central axis of one of the first fin patterns by a first distance in the second direction. The first planar portion may have a first width in the second direction and being greater than the first pitch. The first distance may be about 0.8 times to about 1.2 times the first pitch.

20 Claims, 28 Drawing Sheets

(51) Int. Cl.
*H01L 29/423* (2006.01)
*H01L 29/786* (2006.01)

(58) Field of Classification Search
CPC ..... H01L 21/823431; H01L 21/823412; H01L 29/66795; H01L 27/0886; H01L 29/7854; H01L 21/823481
See application file for complete search history.

(56) References Cited

U.S. PATENT DOCUMENTS

| | | | |
|---|---|---|---|
| 9,991,264 B1 | 6/2018 | Kim et al. | |
| 10,014,300 B2 | 7/2018 | Cantoro et al. | |
| 10,297,555 B2 | 5/2019 | Kuan et al. | |
| 10,325,912 B2 | 6/2019 | Chen et al. | |
| 10,355,110 B2 * | 7/2019 | Chang | H01L 29/0649 |
| 10,396,184 B2 | 8/2019 | Chang et al. | |
| 10,505,023 B2 | 12/2019 | Chen et al. | |
| 10,522,364 B2 | 12/2019 | Kim et al. | |
| 10,586,736 B2 | 3/2020 | Wang et al. | |
| 10,586,859 B2 | 3/2020 | Wang | |
| 10,593,803 B2 | 3/2020 | Anderson et al. | |
| 10,615,080 B2 | 4/2020 | Sun et al. | |
| 10,636,787 B2 | 4/2020 | Chang et al. | |
| 2013/0210232 A1 | 8/2013 | De et al. | |
| 2014/0131813 A1 | 5/2014 | Liaw | |
| 2015/0147874 A1 | 5/2015 | Huang et al. | |
| 2015/0294976 A1 | 10/2015 | Kim et al. | |
| 2016/0247920 A1 | 8/2016 | Ho et al. | |
| 2017/0005102 A1 | 1/2017 | Feng et al. | |
| 2018/0033740 A1 * | 2/2018 | Kuan | H01L 29/7851 |
| 2018/0040713 A1 | 2/2018 | Chang et al. | |
| 2018/0114699 A1 | 4/2018 | Mohanty | |
| 2018/0315763 A1 | 11/2018 | Huang et al. | |
| 2019/0378763 A1 | 12/2019 | Wang et al. | |
| 2020/0013881 A1 | 1/2020 | Chang et al. | |
| 2020/0020782 A1 | 1/2020 | Ching et al. | |
| 2020/0105911 A1 | 4/2020 | Chang | |

* cited by examiner

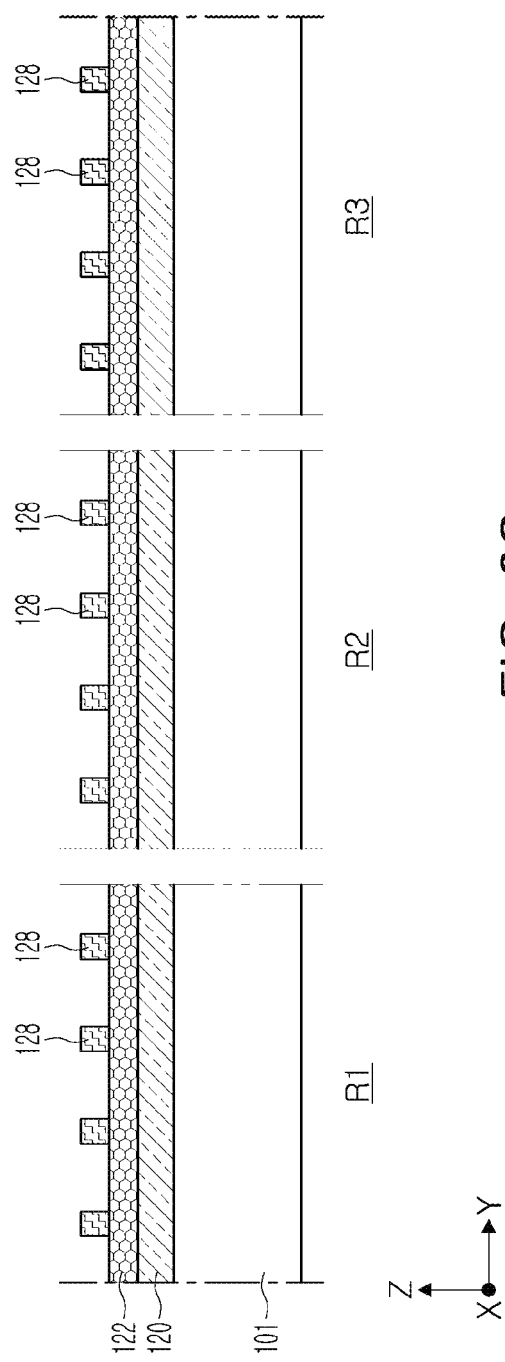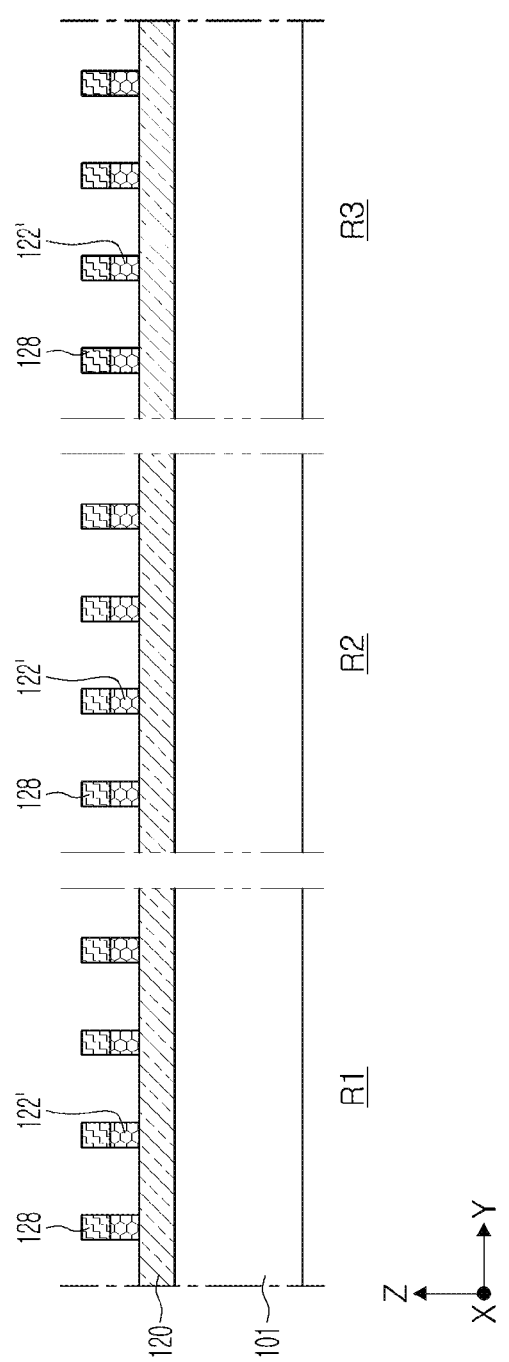

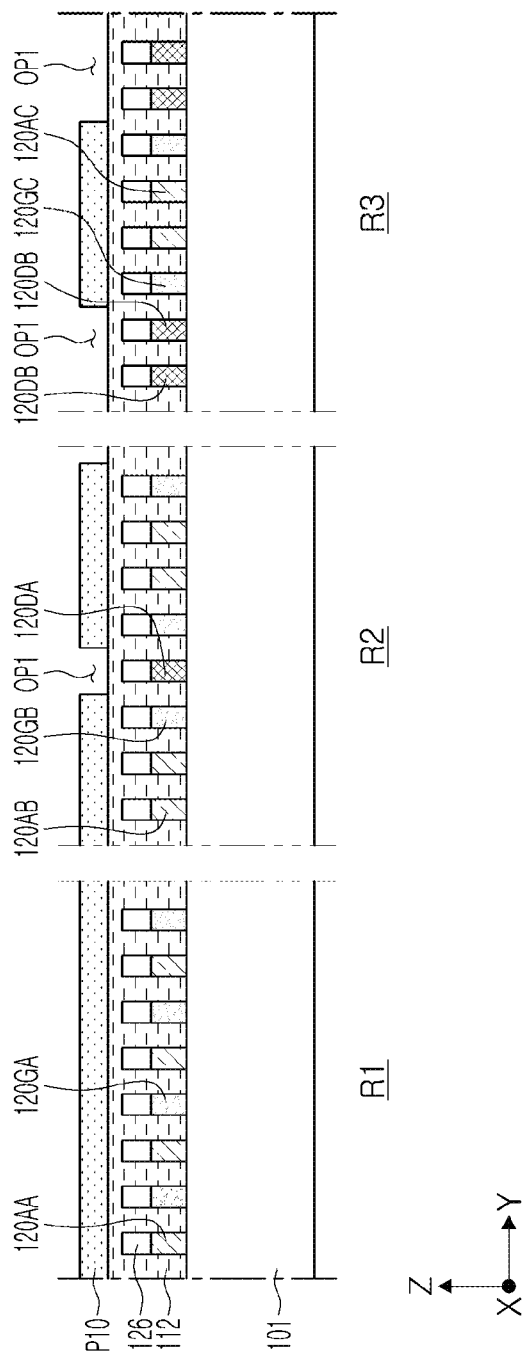
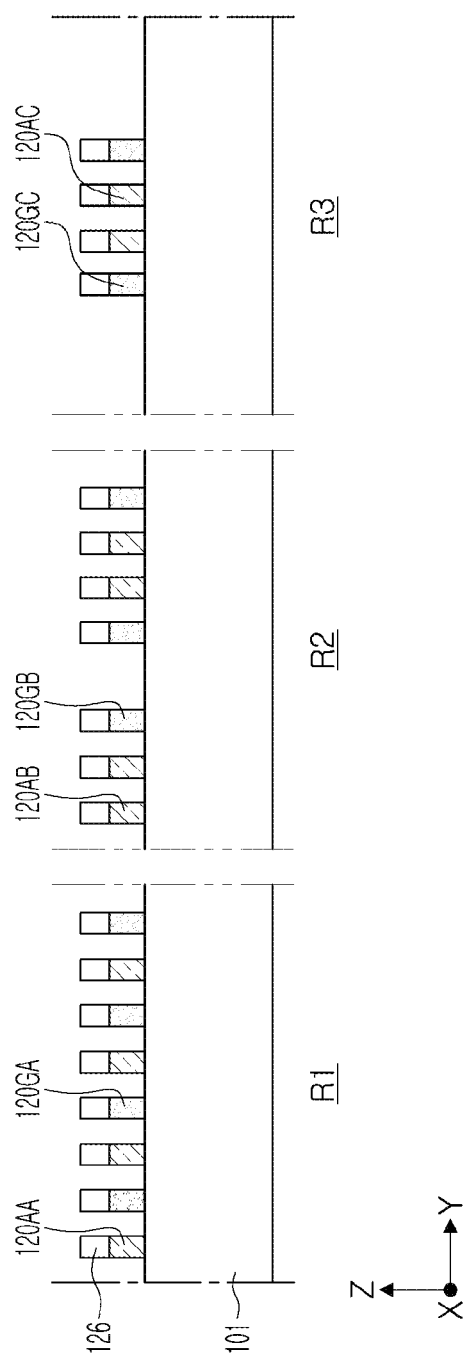
FIG. 7A
FIG. 7B

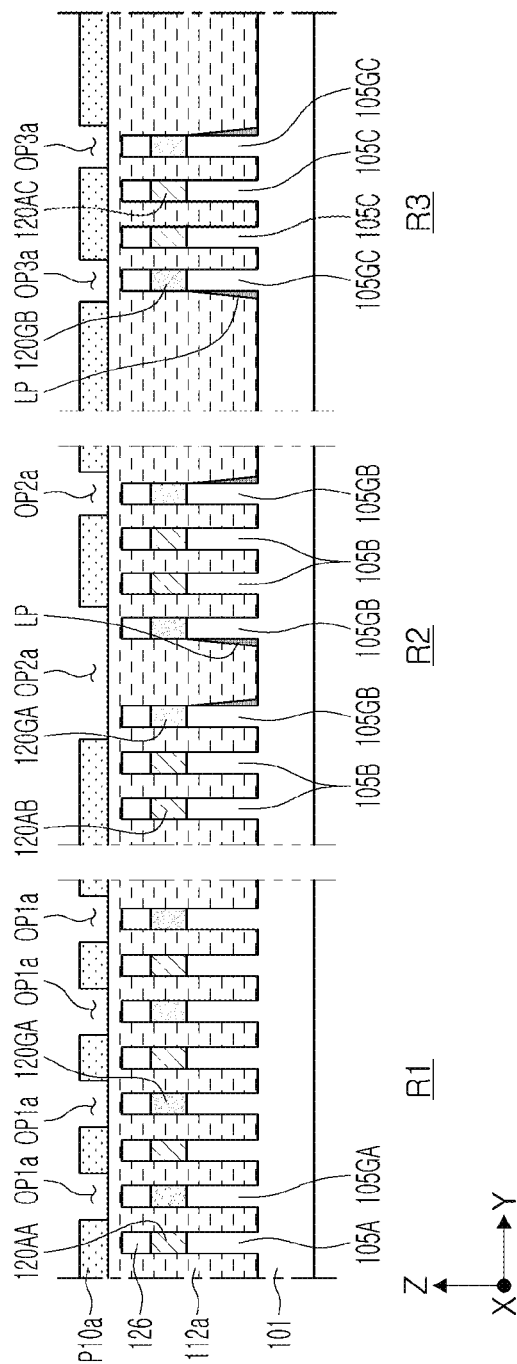
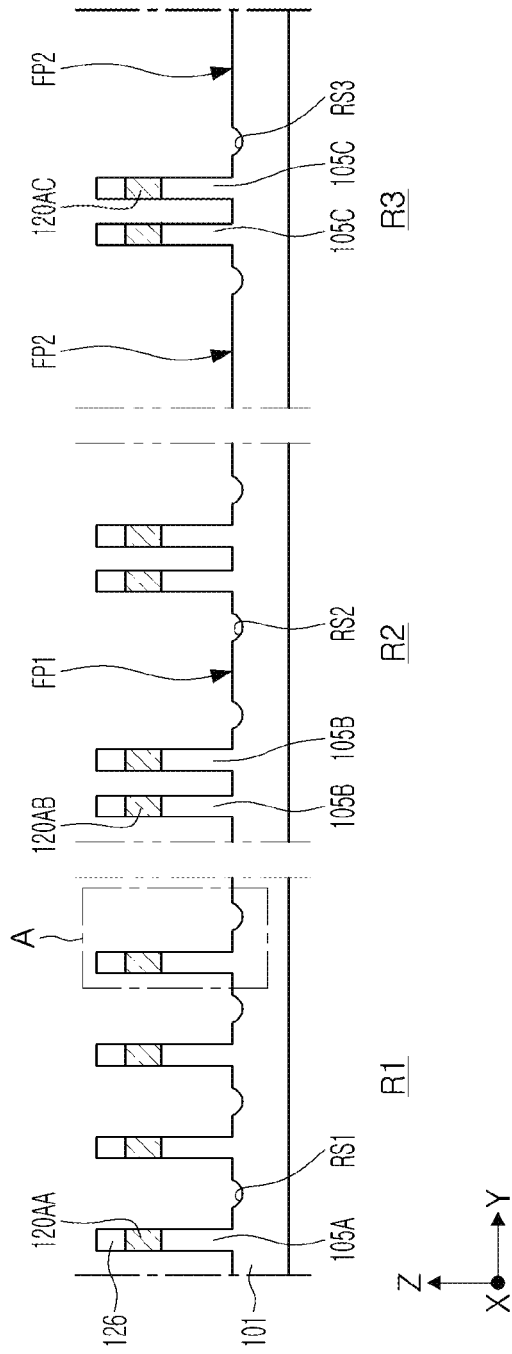
FIG. 11A
FIG. 11B

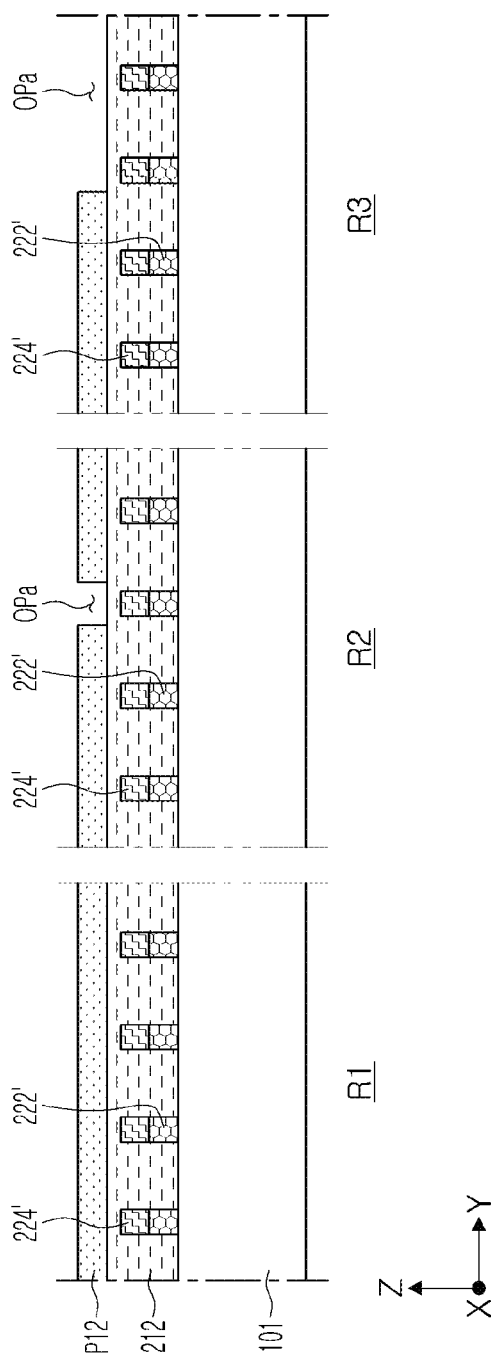
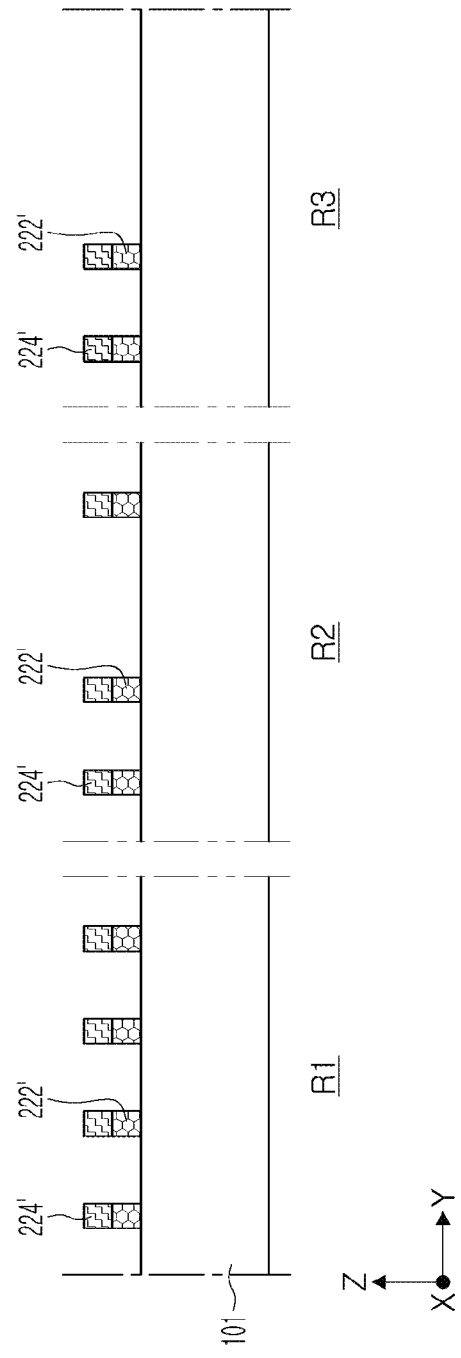
FIG. 18A
FIG. 18B

SEMICONDUCTOR DEVICES AND METHOD OF MANUFACTURING THE SAME

CROSS-REFERENCE TO RELATED APPLICATION(S)

This application is a divisional of U.S. patent application Ser. No. 17/324,610, filed May 19, 2021, which claims benefit of priority to Korean Patent Application No. 10-2020-0125674, filed on Sep. 28, 2020 in the Korean Intellectual Property Office, the disclosure of each of which is incorporated herein by reference in its entirety.

BACKGROUND

Example embodiments of the present disclosure relate to a semiconductor device and a method of manufacturing the same.

As demands for high performance, high speed, and/or multi-functionalization of semiconductor devices have increased, integration density of a semiconductor device has increased. With the trend for high integration density of a semiconductor device, scaling down of transistors in a semiconductor device has been accelerated, and methods for forming transistors having a reduced size have been studied. Also, to overcome the limitation of operation properties caused by reduction in a size of a planar metal oxide semiconductor FET (MOSFET), there have been attempts to develop a semiconductor device including a FinFET having a three-dimensional channel.

SUMMARY

An example embodiment of the present disclosure provides a semiconductor device including fine patterns having a uniform size and/or a method of manufacturing the same.

According to an example embodiment of the present disclosure, a semiconductor device may include a substrate; a device isolation layer on the substrate; a plurality of pattern groups each including fin patterns extending from the substrate, the fin patterns protruding farther upward than an upper surface of the device isolation layer, and the fin patterns extending in a first direction; and gate structures on the substrate. The gate structures may intersect the fin patterns and the gate structures may extend in a second direction intersecting the first direction. The plurality of pattern groups may include a first pattern group including first fin patterns. At least one pair of the first fin patterns may be arranged with a first pitch in the second direction and the first pitch may be a minimum pitch in the second direction of the first fin patterns. The first pattern group may include a first recess portion and a first planar portion of the substrate. The first recess portion may have a central axis spaced apart by a first distance in the second direction from a central axis of a corresponding first fin pattern among the first fin patterns. The first planar portion may extend from the first recess portion and may have a first width in the second direction. The first distance may be about 0.8 times to about 1.2 times the first pitch. The first width may be greater than the first pitch.

According to an example embodiment of the present disclosure, a semiconductor device may include a substrate; a device isolation layer on the substrate; a pattern group including fin patterns extending in a first direction on the substrate; and a gate structure on the substrate. The gate structure may intersect the fin patterns and extend in a second direction perpendicular to the first direction. The fin patterns of the pattern group may include a first fin pattern and a second fin pattern arranged with a minimum pitch in the second direction. The pattern group may include a first recess portion and a second recess portion of the substrate, which may be recessed in the substrate. The first fin pattern and the second fin pattern may be between the first recess portion and the second recess portion. The first recess portion and the second recess portion may be adjacent to the first fin pattern and the second fin pattern, respectively. The pattern group may further include a planar portion of the substrate. The planar portion may extend from at least one of the first recess portion and the second recess portion, and the planar portion may have a substantially planar surface. A width of the substantially planar surface of the planar portion in the second direction may be greater than the minimum pitch.

According to an example embodiment of the present disclosure, a semiconductor device may include a substrate and a device isolation layer. The substrate may include a first planar portion having a first width. The substrate may include a first recess portion and a second recess portion each recessed in the substrate. The first recess portion may have one end connected to one end of the first planar portion. The second recess portion may have one end connected to an other end of the first planar portion. The substrate may include a first fin pattern, a second fin pattern, and a third fin pattern each protruding vertically from the substrate. The first fin pattern may be connected to an other end of the first recess portion. The second fin pattern may be connected to an other end of the second recess portion. The third fin pattern may be arranged with a minimum pitch from a center of one of the first fin pattern and the second fin pattern. The device isolation layer may cover the first planar portion, the first recess portion, and the second recess portion on the substrate. The first width may be greater than a horizontal distance between a central axis of the first recess portion and a central axis of the first fin pattern.

According to an example embodiment of the present disclosure, a method of manufacturing a semiconductor device may include forming a mask layer, a first sacrificial layer, and a second sacrificial layer on a substrate; forming a second sacrificial pattern by etching the second sacrificial layer; forming first spacers on sidewalls of the second sacrificial patterns; selectively removing the second sacrificial patterns with respect to the first spacers; forming first sacrificial patterns by etching the first sacrificial layer using the first spacers as an etching mask; forming second spacers on sidewalls of the first sacrificial patterns; selectively removing the first sacrificial patterns with respect to the second spacers; forming mask patterns by etching the mask layer using the second spacers as an etching mask; removing a portion of the mask patterns using a photolithography process; forming fin patterns and guard fin patterns by etching the substrate using the mask patterns as an etching mask; forming recess portions in the substrate by removing the guard pin patterns using a photolithography process; forming a device isolation layer, such that upper portions of the fin patterns may protrude; removing the first spacers, the second spacers, and the mask patterns; and forming gate structures and source/drain regions.

BRIEF DESCRIPTION OF DRAWINGS

The above and other aspects, features, and effects of inventive concepts in the present disclosure will be more clearly understood from the following detailed description, taken in conjunction with the accompanying drawings, in which:

FIGS. 6A to 16 are cross-sectional diagrams illustrating a method of manufacturing a semiconductor device according to an example embodiment of the present disclosure; and FIGS. 17A to 20B are cross-sectional diagrams illustrating a method of manufacturing a semiconductor device according to an example embodiment of the present disclosure.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments of the present disclosure will be described as follows with reference to the accompanying drawings.

Figure 1:
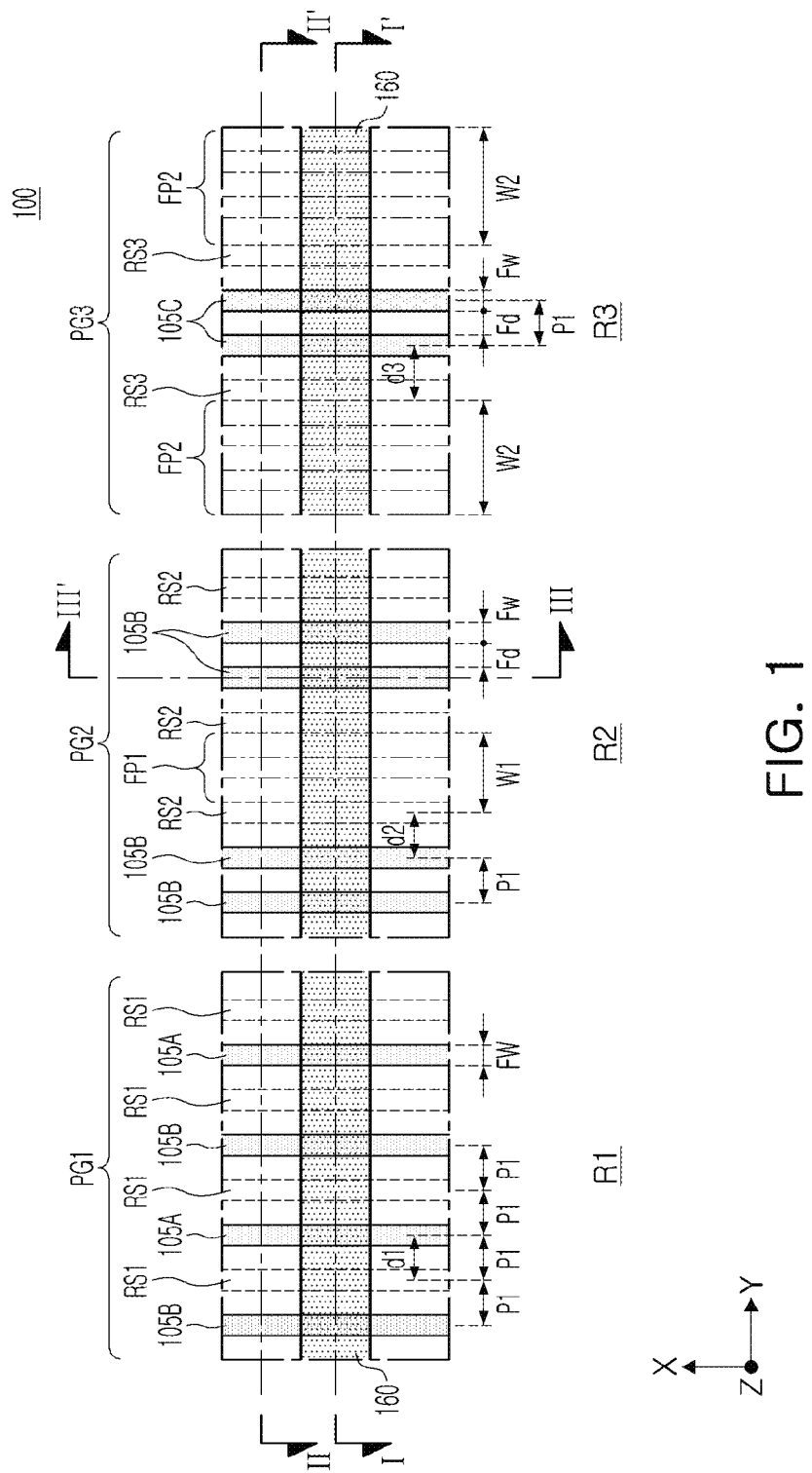
FIG. 1 is a plan diagram illustrating a semiconductor device according to an example embodiment of the present disclosure.
Figure 2A:
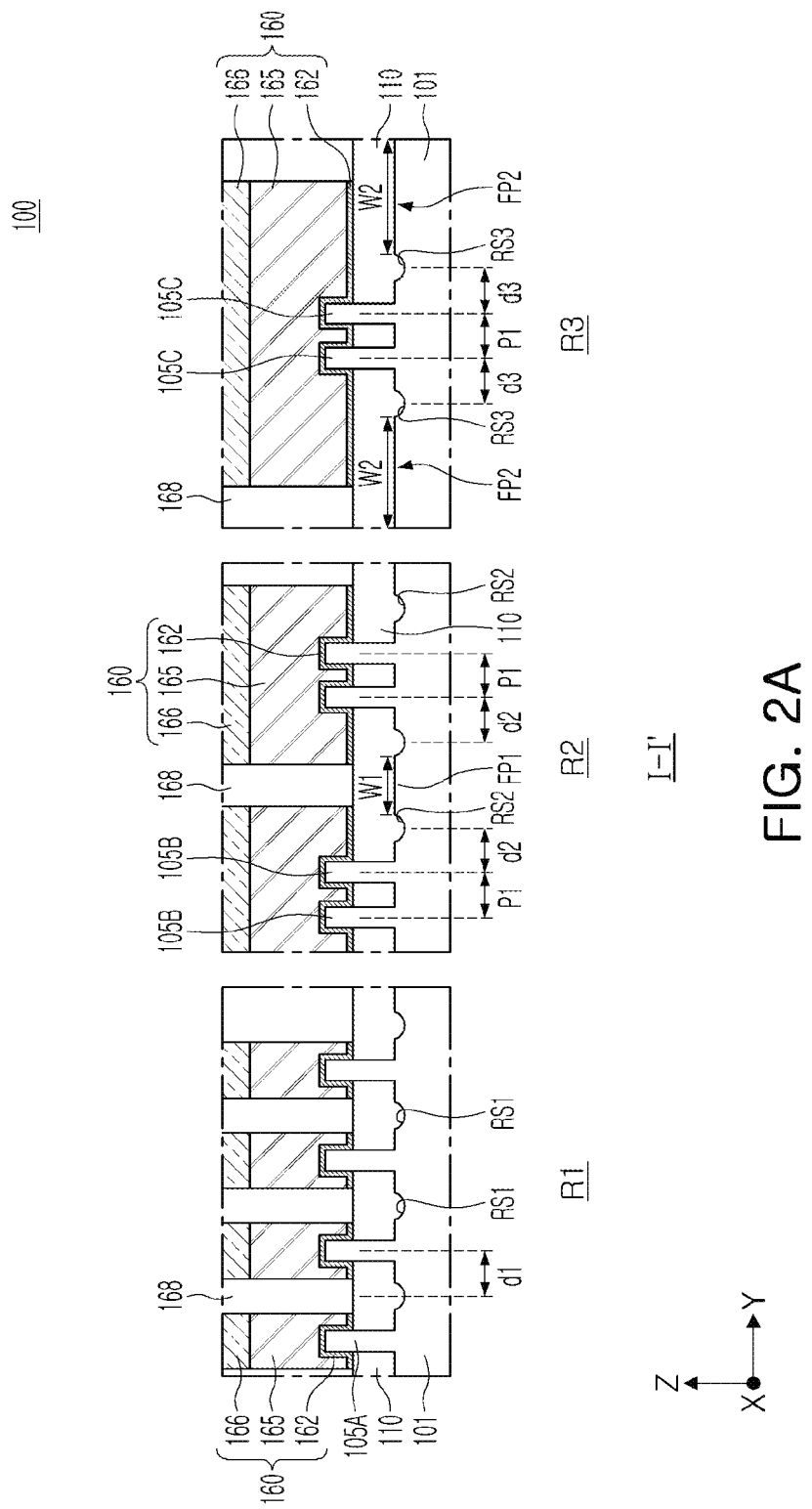
FIGS. 2A to 2C are cross-sectional diagrams illustrating a semiconductor device according to an example embodiment of the present disclosure.
Figure 2B:
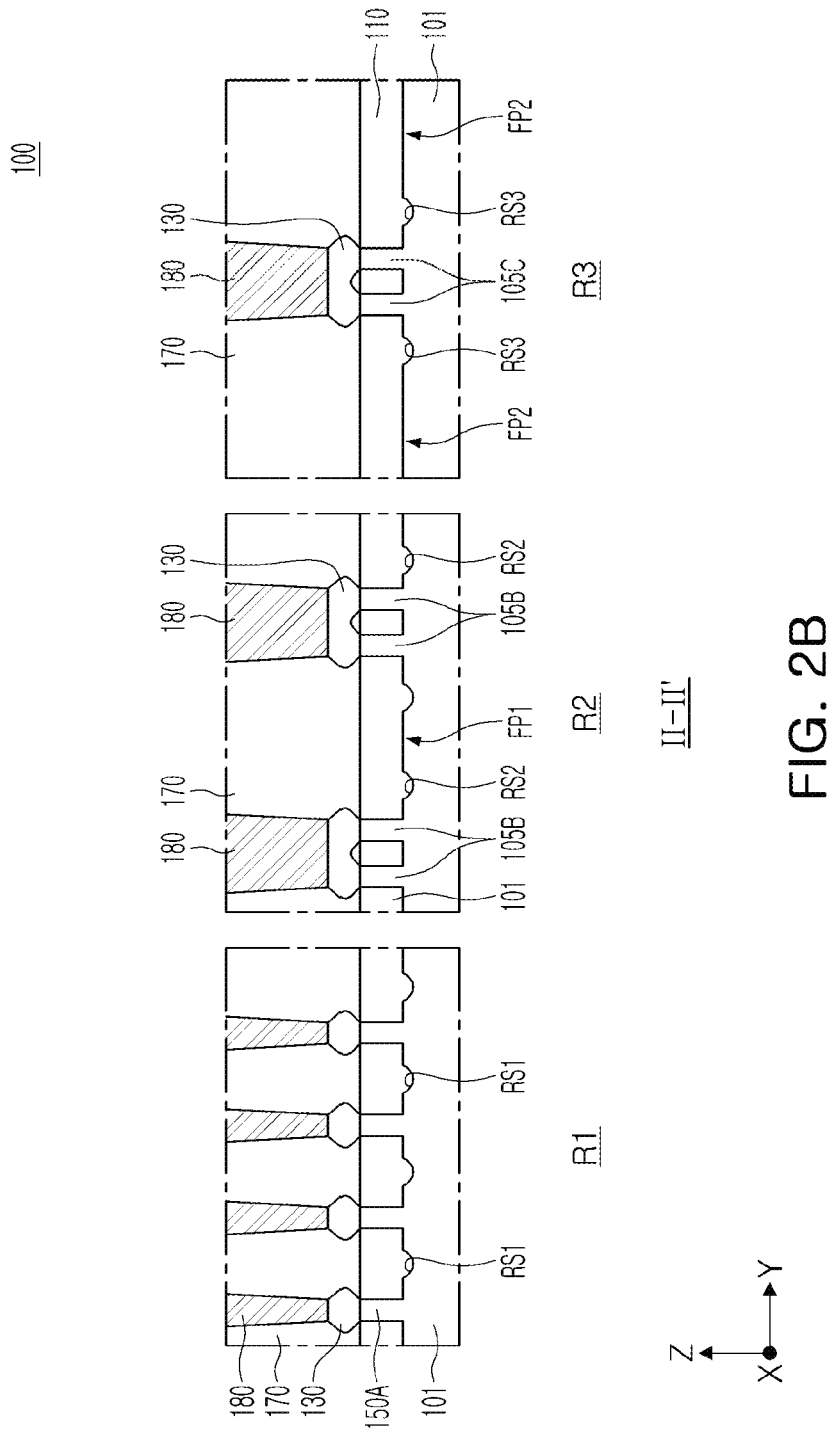
Figure 2C:
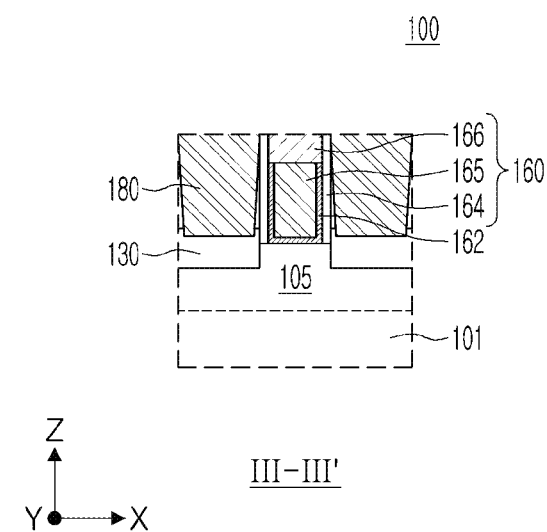

FIG. 1 is a plan diagram illustrating a semiconductor device according to an example embodiment. FIG. 2A is a cross-sectional diagram illustrating a semiconductor device taken along line I-I'. FIG. 2B is a cross-sectional diagram illustrating a semiconductor device taken along line II-II'. FIG. 2C is a cross-sectional diagram illustrating a semiconductor device taken along line III-III'.

Referring to FIGS. 1 to 2C, a semiconductor device 100 may include a substrate 101, fin patterns 105A, 105B, and 105C, a device isolation layer 110, and source/drain regions 130, gate structures 160, interlayer insulating layers 170, and contact structures 180. The semiconductor device 100 may include FinFET devices in which the fin patterns 105A, 105B, and 105C may be configured as transistors having a fin structure.

The substrate 101 may include a semiconductor material, such as a group IV semiconductor, a group III-V compound semiconductor, or a group II-VI oxide semiconductor. For example, a group IV semiconductor may include silicon (Si), germanium (Ge), or silicon-germanium (SiGe). The substrate 101 may be provided as a bulk wafer, an epitaxial layer, a silicon on insulator (SOI) layer, or a semiconductor on insulator (SeOI) layer.

The substrate 101 may have a first region R1, a second region R2, and a third region R3. The first to third regions R1, R2, and R3 may be disposed to be spaced apart from one another or to be adjacent to one another in the semiconductor device 100. In the first to third regions R1, R2, and R3 of the substrate 101, fin patterns 105A, 105B, and 105C extending in the first direction X may be formed using photoresist patterns. In the first to third regions R1, R2, and R3 of the substrate 101, recess portions RS1, RS2, and RS3 may be formed by a process of removing guard fin patterns 105GA, 105GB, and 105GC (see FIG. 9A). First and second planar portions FP1 and FP2 extending from the second and third recess portions RS2 and RS3, respectively, may be formed in the second and third regions R2 and R3 of the substrate 101.

The fin patterns 105A, 105B, and 105C may extend from the substrate 101 and may protrude further than an upper surface of the device isolation layer 110. The fin patterns 105A, 105B, and 105C may be disposed to extend in the first direction X on the substrate 101, and may be spaced apart from one another by a desired and/or alternatively predetermined distance in the second direction Y. The fin patterns 105A, 105B, and 105C may have substantially the same width.

The fin patterns 105A, 105B, and 105C may include a first pattern group PG1 including a single or a plurality of fin patterns 105A formed in the first region R1, a second pattern group PG2 including a single or a plurality of second fin patterns 105B formed in the second region R2, and a third pattern group PG3 including a single or a plurality of third fin patterns 105C formed in the third region R3.

Each of the first to third pattern groups PG1, PG2, and PG3 may be configured as a single pattern group formed on the substrate 101 by a multi-patterning process, such as self-aligned quadruple patterning (SAQP), self-aligned triple patterning (SATP), or self-aligned double (SADP), for example. The number of fin patterns included in a single pattern group is not limited to the example illustrated in the diagrams, and patterns (including dummy patterns) formed in a single pattern group may be arranged with a desired and/or alternatively predetermined pitch P1 or a desired and/or alternatively predetermined spacing by the multi-patterning process. The term "pitch" used in the specification may refer to a distance between a central axis of a first pattern and a central axis of a second pattern adjacent to the first pattern. The central axis of the pattern may be a central axis taken in a direction parallel to the direction in which the pattern extends. For example, the central axis of the pattern extending in the first direction may be defined between lateral surfaces of the pattern opposing each other in the second direction.

Each of the first to third pattern groups PG1, PG2, and PG3 may include the first to third recess portions RS1, RS2, RS3 formed on the substrate 101 by the multi-patterning process, respectively. The second pattern group PG2 may include a first planar portion FP1 formed on the substrate 101 by the multi-patterning process. The third pattern group PG3 may include second planar portions FP2 formed on the substrate 101 by the multi-patterning process. The recess portions RS1, RS2, and RS3 and the planar portions FP1 and FP2 may be configured as patterns formed on a surface of the substrate 101 and may also be understood as components included in the substrate 101.

As illustrated in the first region R1 in FIG. 1, the first fin pattern 105A and the first recess portion RS1 of the first pattern group PG1, adjacent to each other, may be arranged with a pitch substantially the same as a minimum pitch P1 in the second direction Y. The first fin patterns 105A of the first pattern group PG1 may be arranged with a second pitch greater than the minimum pitch P1. The second pitch may be substantially equal to about twice the minimum pitch P1.

As illustrated in the second region R2 in FIG. 1, the second fin patterns 105B of the second pattern group PG2, adjacent to each other, may be arranged with the minimum pitch P1 in the second direction Y, and the second fin patterns 105B and the second recess portions RS2 adjacent to each other may be arranged with a pitch substantially the same as the minimum pitch P1 in the second direction Y. As illustrated in the third region R3 in FIG. 1, the third fin patterns 105C of the third pattern group PG3, adjacent to each other, may be arranged with the minimum pitch P1 in the second direction Y, and the third fin pattern 105C and the third recess portion RS3 adjacent to each other may be arranged with a pitch substantially the same as the minimum pitch P1 in the second direction Y.

As illustrated in the second region R2 and the third region R3 in FIG. 1, the first and second planar portions FP1 and FP2 may refer to planar surfaces of the substrate 101 on which the pattern is not disposed, and may also correspond to a region (a region indicated by a dashed-dotted line) in which a mask pattern is disposed in an upper portion of the substrate 101 in the multi-patterning process. In this case, a central axis of the mask patterns corresponding to the first and second planar portions FP1 and FP2, respectively, may be disposed with a pitch substantially the same as the minimum pitch P1 in the second direction Y from a center of the adjacent second recess portion RS2 or the third recess portion RS3.

The phrase "substantially the same" used in the specification may be used in consideration of an error in a process which may occur in a process of manufacturing a semiconductor device. For example, the notion that "first distance" and "second distance" are substantially the same may indicate that either one corresponds to about 0.8 to about 1.2 times the other, or about 0.7 to about 1.3 times the other.

The first recess portions RS1 may be disposed to be adjacent to the first fin patterns 105A of the first pattern group PG1 and may extend in the first direction X. The first recess portions RS1 may be disposed at a level lower than a level of upper ends of the first fin patterns 105A. The first recess portions RS1 may be patterns formed on the surface of the substrate 101 between the first fin patterns 105A, and in example embodiments, a shape of the recess portions RS1 may be varied depending on an etched depth of the guard fin pattern 105GA (see FIG. 9A). For example, the first recess portions RS1 may have a downwardly concave shape as illustrated in the first region R1 in FIG. 2A, but an example embodiment thereof is not limited thereto.

The first recess portion RS1 may have a center spaced apart from the center of the adjacent first fin pattern 105A by a first distance d1 in the second direction Y. The first distance d1 may be substantially the same as the minimum pitch P1, or may be about 0.8 times to about 1.2 times the minimum pitch P1. The first distance d1 may be smaller than the second pitch of the first fin patterns 105A of the first region R1.

The second recess portions RS2 may be disposed to be adjacent to the second fin patterns 105B of the second pattern group PG2 and may extend in the first direction X. The second recess portions RS2 may be disposed at a level lower than a level of the upper ends of the second fin patterns 105B. Similarly to the first recess portions RS1, a shape of the second recess portions RS2 may be varied depending on an etching depth of the guard fin pattern.

As illustrated in the second region R2 in FIG. 2A, two pairs of the second fin patterns 105B may be disposed, and a pair of the second recess portions RS2 and the first planar portion FP1 may be disposed between the two pairs of second fin patterns 105B. Each of the pair of second recess portions RS2 may have a center spaced apart from the center of the adjacent pair of second fin patterns 105B by a second distance d2 in the second direction Y. The second distance d2 may be substantially the same as the minimum pitch P1, or may be about 0.8 times to about 1.2 times the minimum pitch P1.

The first planar portion FP1 may be disposed between the pair of second recess portions RS2. The first planar portion FP1 may refer to a portion of the surface of the substrate 101 which may be substantially smooth without unevenness. The first planar portion FP1 may have a first width W1 in the second direction Y. The first width W1 of the first planar portion FP1 may be equal to or larger than the minimum pitch P1. The first width W1 of the first planar portion FP1 may be less than about 2 times the minimum pitch P1 or may be equal to about 2 times the minimum pitch P1. In example embodiments, the first width W1 of the first planar portion FP1 may be greater than about 2 times the minimum pitch P1, greater than about 2 times the minimum pitch P1 and less than about 4 times the minimum pitch P1, for example.

The first planar portion FP1 may be a region from which the upper mask pattern is removed during the process of manufacturing the semiconductor device such that the fin pattern is not formed, and the first width W1 of the first planar portion FP1 may be varied, depending on the number of the mask patterns removed from the upper portion. For example, when only one mask pattern 120DA (see FIG. 7A) is removed from the upper portion of the substrate 101, the first width W1 of the first planar portion FP1 may be substantially the same as a sum of two times a distance Fd between lateral surfaces of the second fin patterns 105B opposing each other and a width Fw of the second fin patterns 105B. Alternatively, the first width W1 of the first planar portion FP1 may be substantially the same as a value obtained by subtracting the width Fw of one of the second fin patterns 105B from twice the minimum pitch P1.

One end of the first planar portion FP1 may be connected to one end of the second recess portion RS2, and the other end of the first planar portion FP1 may be connected to one of the other second recess portion RS2. The other end of the second recess portion RS2 connected to one end of the first planar portion FP1 may be connected to the second fin pattern 105B, and the other end of the second recess portion RS2 connected to the other end of the first planar portion FP1 may be connected to another second fin pattern 105B.

The third recess portions RS3 may be disposed to be adjacent to the third fin patterns 105C of the third pattern group PG3 and may extend in the first direction X. The third recess portions RS3 may be disposed at a level lower than a level of the upper ends of the third fin patterns 105C. Similarly to the first recess portions RS1, a shape of the third recess portions RS3 may be varied depending on the etching depth of the guard fin pattern.

As illustrated in the third region R3 in FIG. 2A, a pair of third recess portions RS3 and a pair of second planar portions FP2 may be disposed with a pair of third fin patterns 105C interposed therebetween. Each of the pair of third recess portions RS3 may have a center spaced apart from the center of the pair of adjacent third fin patterns 105C by a third distance d3 in the second direction Y. The third distance d3 may be substantially the same as the minimum pitch P1, or may be about 0.8 times to about 1.2 times the minimum pitch P1.

The pair of second planar portions FP2 may be disposed on both sides of the pair of third recess portions RS3 with the pair of third recess portions RS3 interposed therebetween. The pair of second planar portions FP2 may refer to a portion of the surface of the substrate 101 which may be substantially smooth without unevenness. Each of the pair of second planar portions FP2 may have a second width W2 in the second direction Y. The second width W2 of the second planar portion FP2 may be greater than about twice the minimum pitch P1 or may be equal to twice the minimum pitch P1. The second width W2 may be greater than the first width W1.

The second planar portion FP2 may be a region from which the upper mask pattern is removed during the process of manufacturing the semiconductor device such that the fin pattern may not be formed, and the second width W2 of the second planar portion FP2 may be varied depending on the number of the mask patterns removed from the upper portion. For example, when two mask patterns 120DB (see FIG. 7A) arranged adjacent to each other in the second direction Y is removed from the upper portion of the substrate 101, the second width W2 of the second planar portion FP2 may be substantially the same as a sum of three times the distance Fd between the opposing sides of the pair of third fin patterns 105C and twice the width Fw of one of the third fin patterns 105C. Alternatively, the second width W2 of the second planar portion FP2 may be substantially the same as a value obtained by subtracting the width Fw of one of the third fin patterns 105C from three times the minimum pitch P1.

However, in example embodiments, the second planar portions FP2 may extend further to an external side of the third pattern group PG3 in the third region R3.

In example embodiments, the second width W2 of the second planar portion FP2 may also be varied depending on the arrangement of the third fin patterns FP3 in the third pattern group PG3. For example, in the third region R3, when the third recess portion RS3 (the outermost pattern in the third pattern group), a pair of third fin patterns FP3, the third recess portion RS3 (the inner pattern in the third pattern group) are arranged in order from the left to right, the second width W2 of the second planar portion FP2 adjacent to the third recess portion RS3 (the inner pattern in the third pattern group) may be greater than about 4 times the minimum pitch P1 or may be the same as 4 times the minimum pitch P1.

The device isolation layer 110 may define fin patterns 105A, 105B, and 105C in the substrate 101. The device isolation layer 110 may be formed by, for example, a shallow trench isolation (STI) process. The device isolation layer 110 may cover portions of lateral surfaces of the fin patterns 105A, 105B, and 105C and an upper surface of the substrate 101. The device isolation layer 110 may cover the first to third recess portions RS1, RS2, and RS3 and the planar portions FP1 and FP2 formed on the substrate 101. The device isolation layer 110 may be formed of an insulating material. The device isolation layer 110 may be, for example, an oxide, a nitride, or a combination thereof.

The source/drain regions 130 may be disposed on the fin patterns 105A, 105B, and 105C on both sides of the gate structure 160. The fin patterns 105A, 105B, and 105C may be partially recessed on both sides of the gate structures 160 as illustrated in FIG. 2B, and source/drain regions 130 may disposed on the recessed fin patterns 105A, 105B, and 105C. The source/drain regions 130 may be provided as source regions or drain regions of transistors of the semiconductor device 100. The source/drain regions 130 may be connected to each other or may be merged on two or more fin patterns and may form a single source/drain region 130, but an example embodiment thereof is not limited thereto.

The source/drain regions 130 may be a semiconductor layer including silicon (Si), and may be formed of an epitaxial layer. The source/drain regions 130 may include n-type impurities or p-type impurities. The source/drain regions 130 may be a semiconductor layer including silicon germanium (SiGe). In example embodiments, the source/drain regions 130 may include a plurality of regions including elements and/or doping elements of different concentrations.

The gate structure 160 may be disposed to intersect the fin patterns 105A, 105B, and 105C and may extend in the second direction Y in an upper portion of the fin patterns 105A, 105B, and 105C. Channel regions of transistors may be formed in the fin patterns 105A, 105B, and 105C intersecting the gate structure 160. The gate structure 160 may include a gate electrode 165, a gate dielectric layer 162 between the gate electrode 165 and the fin patterns 105A, 105B, and 105C, spacer layers 164 on lateral surfaces of the gate electrode 165, and a gate capping layer 166 on an upper surface of the gate electrode 165.

The gate dielectric layer 162 may be disposed between the fin patterns 105A, 105B, and 105C and the gate electrode 165, and may cover at least a portion of the surfaces of the gate electrode 165. For example, the gate dielectric layer 162 may be disposed to surround all surfaces of the gate electrode 165 other than the uppermost surface. The gate dielectric layer 162 may extend to a region between the gate electrode 165 and the spacer layers 164, but an example embodiment thereof is not limited thereto. The gate dielectric layer 162 may include oxide, nitride, or a high-k material. The high-k material may refer to a dielectric material having a dielectric constant higher than that of a silicon oxide layer ($SiO_2$). The high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed in an upper portion of the fin patterns 105A, 105B, and 105C. The gate electrode 165 may be spaced apart from the fin patterns 105A, 105B, and 105C by the gate dielectric layer 162. The gate electrode 165 may include a conductive material, and may include, for example, metal nitride such as a titanium nitride film (TiN), a tantalum nitride film (TaN), or a tungsten nitride film (WN), and/or a metal material such as aluminum (Al), tungsten (W), or molybdenum (Mo), or a semiconductor material such as doped polysilicon. The gate electrode 165 may be formed of two or more layers. The gate electrodes 165 may be isolated from each other by a gate isolation pattern 168 between adjacent transistors.

Spacer layers 164 may be disposed on both lateral surfaces of the gate electrode 165. The spacer layers 164 may insulate the source/drain regions 130 and the gate electrodes 165. The spacer layers 164 may have a multilayer structure in example embodiments. The spacer layers 164 may be formed of oxide, nitride, and oxynitride, and may be formed of a low-k film.

The gate capping layer 166 may be disposed in an upper portion of the gate electrode 165, and a lower surface and lateral surfaces thereof may be surrounded by the gate electrode 165 and the spacer layers 164.

The interlayer insulating layer 170 may be disposed to cover the device isolation layer 110, the source/drain regions 130, and the gate capping layer 166. The interlayer insulating layer 170 may include at least one of oxide, nitride, and oxynitride, for example, and may include a low-k material.

The contact structure 180 may penetrate the interlayer insulating layer 170 and may be connected to the source/drain regions 130, and may apply an electric signal to the source/drain regions 130. The contact structure 180 may have an inclined lateral surface of which a width of a lower portion is narrower than a width of an upper portion depending on an aspect ratio, but an example embodiment thereof is not limited thereto. The contact structure 180 may be disposed to be in contact with upper surfaces of the source/drain regions 130 without recessing into the source/drain regions 130.

The contact structure 180 may include a conductive layer, a metal-semiconductor compound layer between the conductive layer and the source/drain regions 130, and a contact barrier metal layer surrounding the conductive layer. The conductive layer may include W, Co, Ti, an alloy thereof, or a combination thereof. The metal-semiconductor compound layer may be a silicide layer, and may include, for example, CoSi, NiSi, or TiSi. The contact barrier metal layer may include TiN, TaN, WN, or a combination thereof.

Figure 3A:
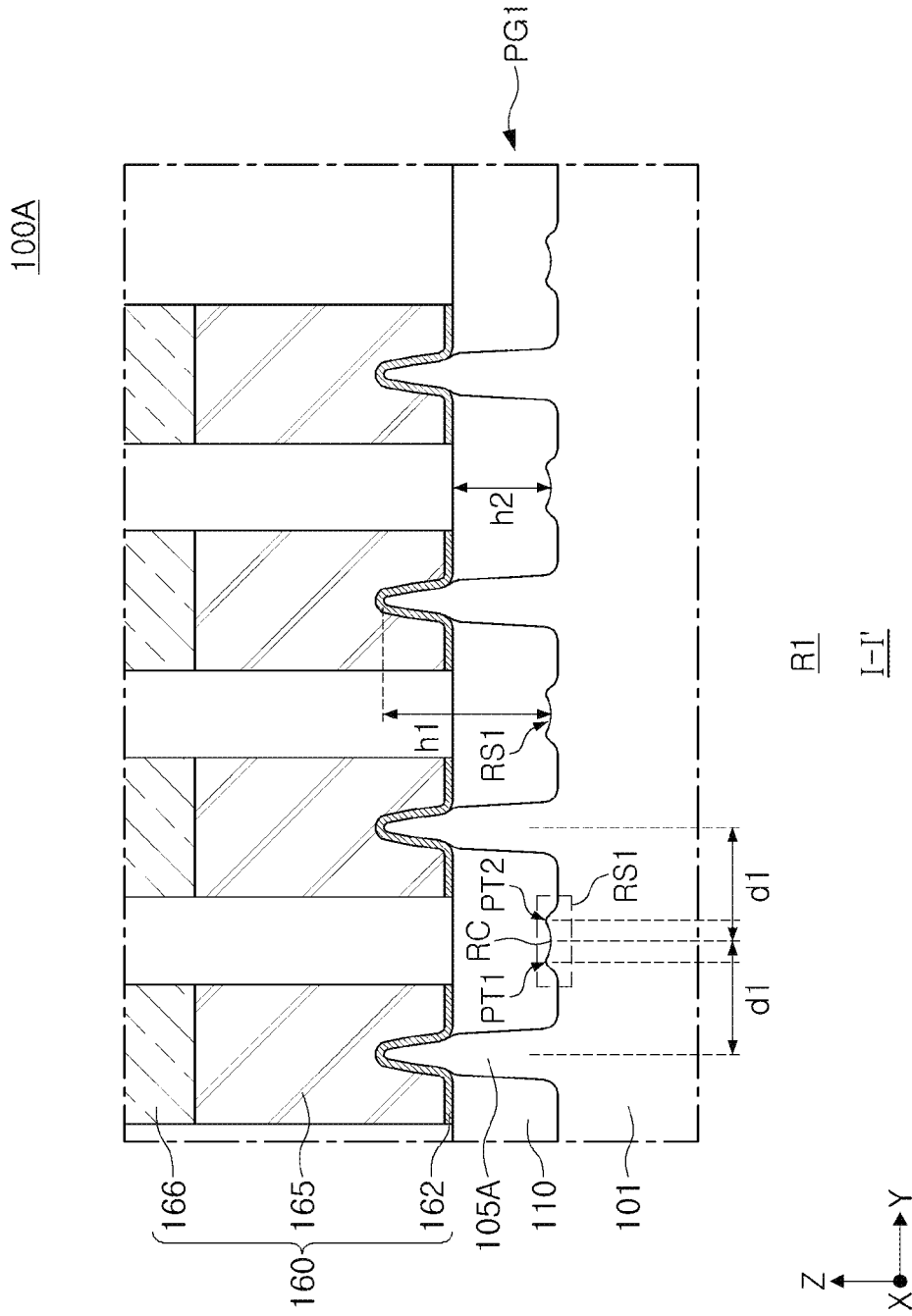
FIGS. 3A to 3C are cross-sectional diagrams illustrating a semiconductor device according to an example embodiment of the present disclosure.
Figure 3B:
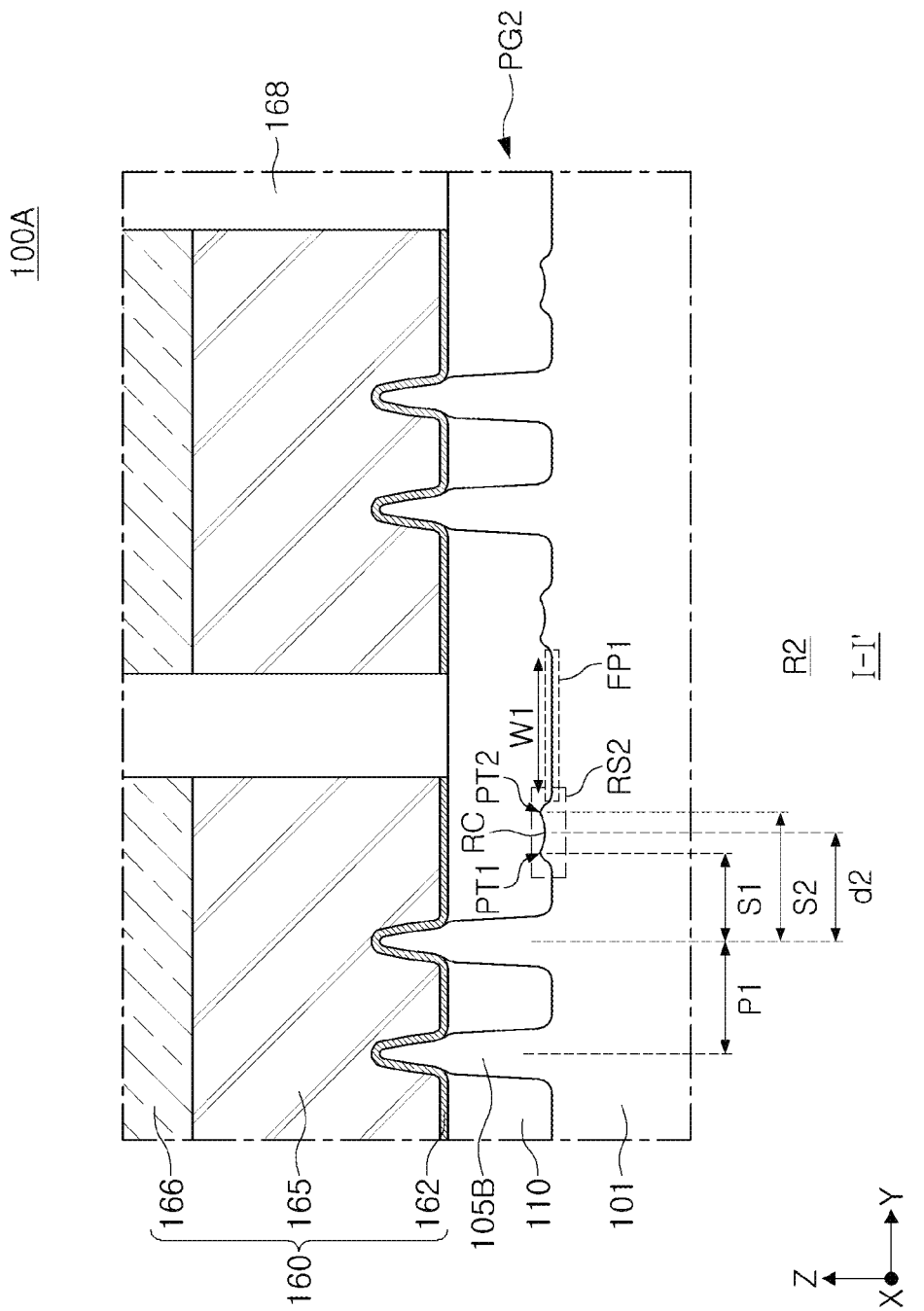
Figure 3C:
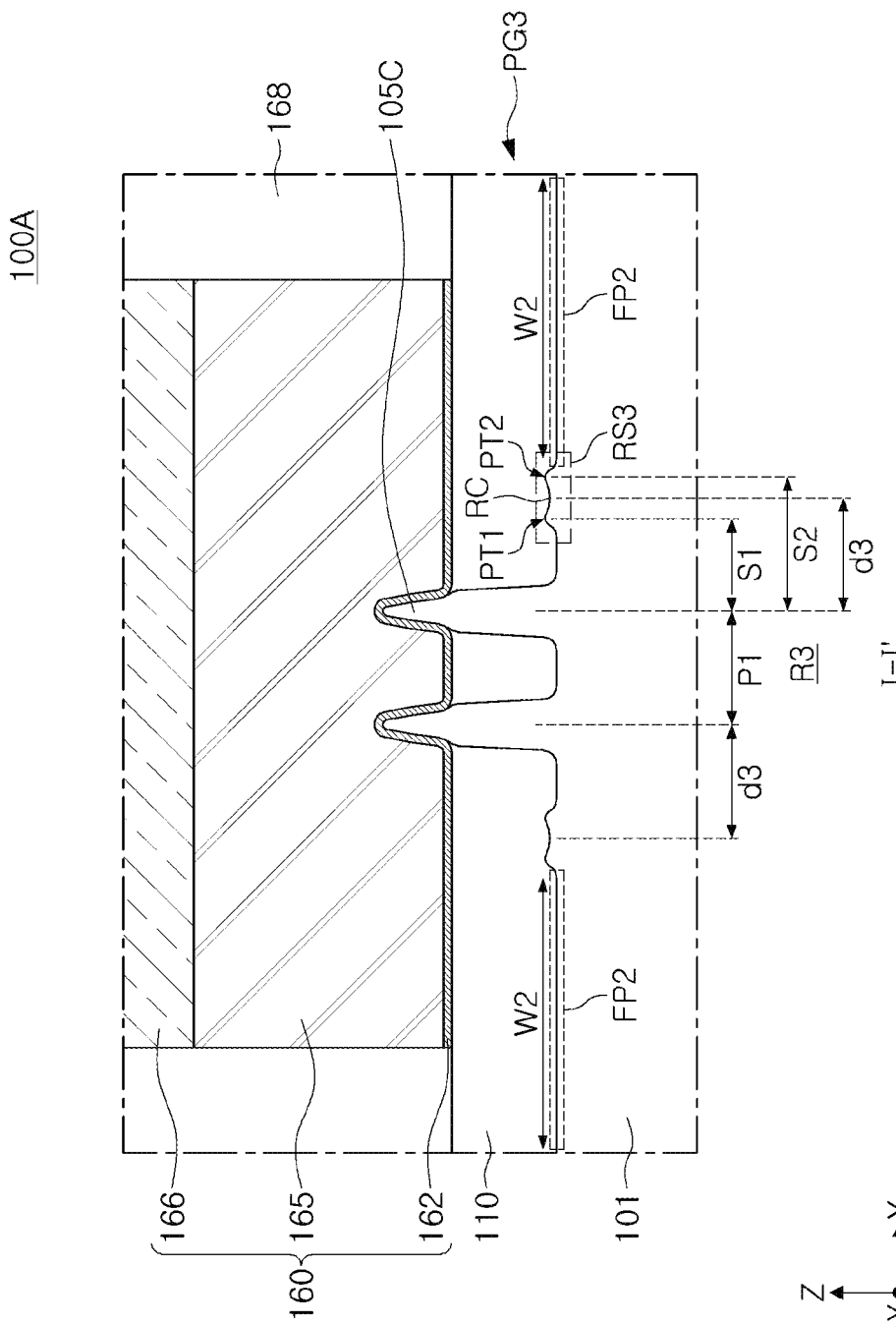

FIGS. 3A to 3C are cross-sectional diagrams illustrating a semiconductor device according to an example embodiment. FIG. 3A is an enlarged diagram illustrating a region corresponding to a first region R1 illustrated in FIG. 2A. FIG. 3B is an enlarged diagram illustrating a region corresponding to a first region R2 illustrated in FIG. 2A. FIG. 3C is an enlarged diagram illustrating a region corresponding to a third region R3 illustrated in FIG. 2A.

FIG. 3A illustrates an example shape of patterns of the first pattern group PG1 in the first region R1 of the substrate 101 of the semiconductor device 100A.

The first fin patterns 105A may have a shape protruding from the substrate 101 and having a width decreasing upwardly in the second direction Y. The first fin patterns FP1 may be spaced apart from each other with a pitch of about twice the minimum pitch P1 by guard fin patterns removed from a region between the first fin patterns 105A.

The first recess portions RS1 may include protrusions PT1 and PT2 and a concave portion RC recessed between the protrusions PT1 and PT2. The protrusions PT1 and PT2 may have a double-humped shape protruding upwardly towards the upper surface of the device isolation layer 110. A central axis of the concave portion RC may be spaced apart from a central axis of the adjacent first fin patterns 105A by a first distance d1 in the second direction Y. The relationship between the first distance d1 and the minimum pitch P1 may be the same as described in the aforementioned example embodiment.

A lower end of the concave portion RC may be disposed at a level lower than a level of an upper end of the first fin patterns 105A by about 60 nm or more. The level may be determined on the basis of the planar surface of the substrate 101. Upper ends of the protrusions PT1 and PT2 may be disposed at a level higher than a level of a lower end of the concave portion RC. The protrusions PT1 and PT2 may include a curved portion. The first and second protrusions PT1 and PT2 may have a curved shape having a relatively smooth end as compared to the example in which the dummy fin patterns are removed using a deep trench isolation process. The protrusions PT1 and PT2 may be formed by removing the guard fin patterns 105GA (see FIG. 9A) formed in the process of manufacturing the semiconductor device. In example embodiments, the first recess portion RS1 may include one of the first and second protrusions PT1 and PT2.

A lower end of the concave portion RC may be disposed at a level from lower than the upper end of the first fin pattern 105A by a first depth h1. The lower end of the concave portion RC may be disposed at a lower level from the upper surface of the device isolation layer 110 by a second depth h2. In an example embodiment, the first depth h1 may be about 60 nm or more, about 60 nm or more and about 170 nm or less, for example. The first depth h1 may be, for example, about 60 nm or more and about 150 nm or less. The second depth h2 may be about 10 nm or more, about 10 nm or more and about 120 nm or less, for example. The second depth h2 may be, for example, about 10 nm or more and about 110 nm or less. When the first depth h1 and the second depth h2 are larger or smaller than the above range, the dummy fin or the ghost fin may remain, which may deteriorate electrical properties of the semiconductor device.

FIG. 3B illustrates example shapes of patterns of the second pattern group PG2 in the second region R2 of the substrate 101 of the semiconductor device 100A.

A pair of second fin patterns 105B may have a shape protruding from the substrate 101 and having a width decreasing upwardly in the second direction Y. The pair of second fin patterns 105B adjacent to each other may be spaced apart from each other with the minimum pitch P1.

Each of the second recess portions RS2 may include a first protrusion PT1, a second protrusion PT2, and a concave portion RC recessed between the first and second protrusions PT1 and PT2. The protrusions PT1 and PT2 may have a double-humped shape protruding upwardly towards the upper surface of the device isolation layer 110. The central axis of the concave portion RC may be spaced apart from the central axis of the second fin patterns 105B by a first distance d1 in the second direction Y. The relationship between the first distance d1 and the minimum pitch P1 may be the same as described above. The second recess portions RS2 may have a shape similar to that of the first recess portions RS1, and the description of the first recess portions RS1 may be also applied to the second recess portions RS2.

The first protrusion PT1 may be spaced apart from the second fin pattern 105B adjacent to the first protrusion PT1 of the pair of second fin patterns 105B by a first spacing S1 in the second direction Y. The second protrusion PT2 may be adjacent to the first planar portion FP1 and may be spaced apart from the second fin pattern 105B by a second spacing S2 in the second direction Y. The first spacing S1 may refer to a distance between the central axis of the second fin pattern 105B and the upper end of the first protrusion PT1, and the second spacing S2 may refer to a distance between the central axis of the pattern 105B and the upper end of the second protrusion PT2. The first spacing S1 may be about 0.5 to about 0.8 times the minimum pitch P1, and the second spacing S2 may be about 1.2 to about 1.5 times the minimum pitch P1.

The first planar portion FP1 may be disposed to be connected to the pair of first recess portions RS1 between the pair of first recess portions RS1. The first planar portion FP1 may refer to a portion of the upper surface of the substrate 101 substantially planar. The relationship between the first width W1 of the first planar portion FP1 and the minimum pitch P1 may be the same as described above.

The first recess portion RS1 disposed on one side of the first planar portion FP1 may be spaced apart from the first fin pattern 105A adjacent to the first recess portion RS1 by a second distance d2, and the other first recess portion RS1 disposed on the other side of the first planar portion FP1 may be spaced apart from the other first fin pattern 105A to the other first recess portion RS1 by a third distance. The relationship between the second distance d2 and the minimum pitch P1 described above may also be applied to the description of the third distance in the second region R2.

FIG. 3C illustrates example shapes of patterns of the third pattern group PG3 in the third region R3 of the substrate 101 of the semiconductor device 100A.

The pair of third fin patterns 105C may have a shape protruding from the substrate 101 and having a width decreasing upwardly in the second direction Y. The pair of third fin patterns 105C adjacent to each other may be spaced apart from each other with the minimum pitch P1.

Each of the third recess portions RS3 may include the first protrusion PT1, the second protrusion PT2, and the concave portion RC recessed between first and second protrusions PT1 and PT2 as described in the aforementioned example embodiment with reference to FIG. 3A. The protrusions PT1 and PT2 may have a double-humped shape protruding upwardly towards the upper surface of the device isolation layer 110. The central axis of the concave portion RC may be spaced apart from the central axis of the third fin patterns 105C by a third distance d3 in the second direction Y. The relationship between the third distance d3 and the minimum pitch P1 may be the same as in the aforementioned example embodiment described above. The third recess portions RS3 may have a shape similar to the second recess portions RS2, and the description of the second recess portions RS1 may also be applied to the third recess portions RS3.

A pair of second planar portions FP2 may extend from each of the pair of third recess portions RS3 and may be substantially planar. The description of the second width W2 of the pair of second planar portions FP2 may be the same as in the aforementioned example embodiment.

Figure 4A:
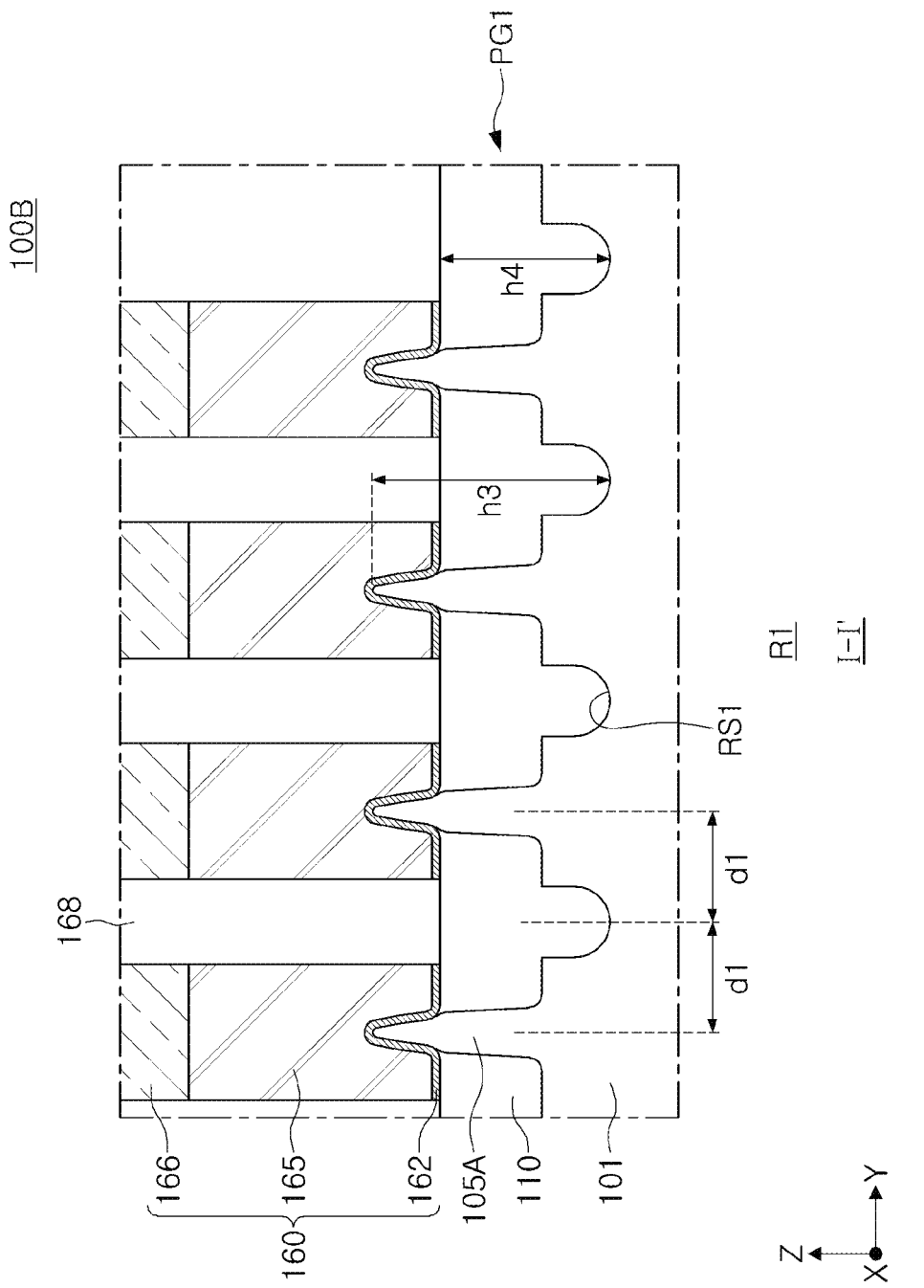
FIGS. 4A to 4C are cross-sectional diagrams illustrating a semiconductor device according to an example embodiment of the present disclosure.
Figure 4B:
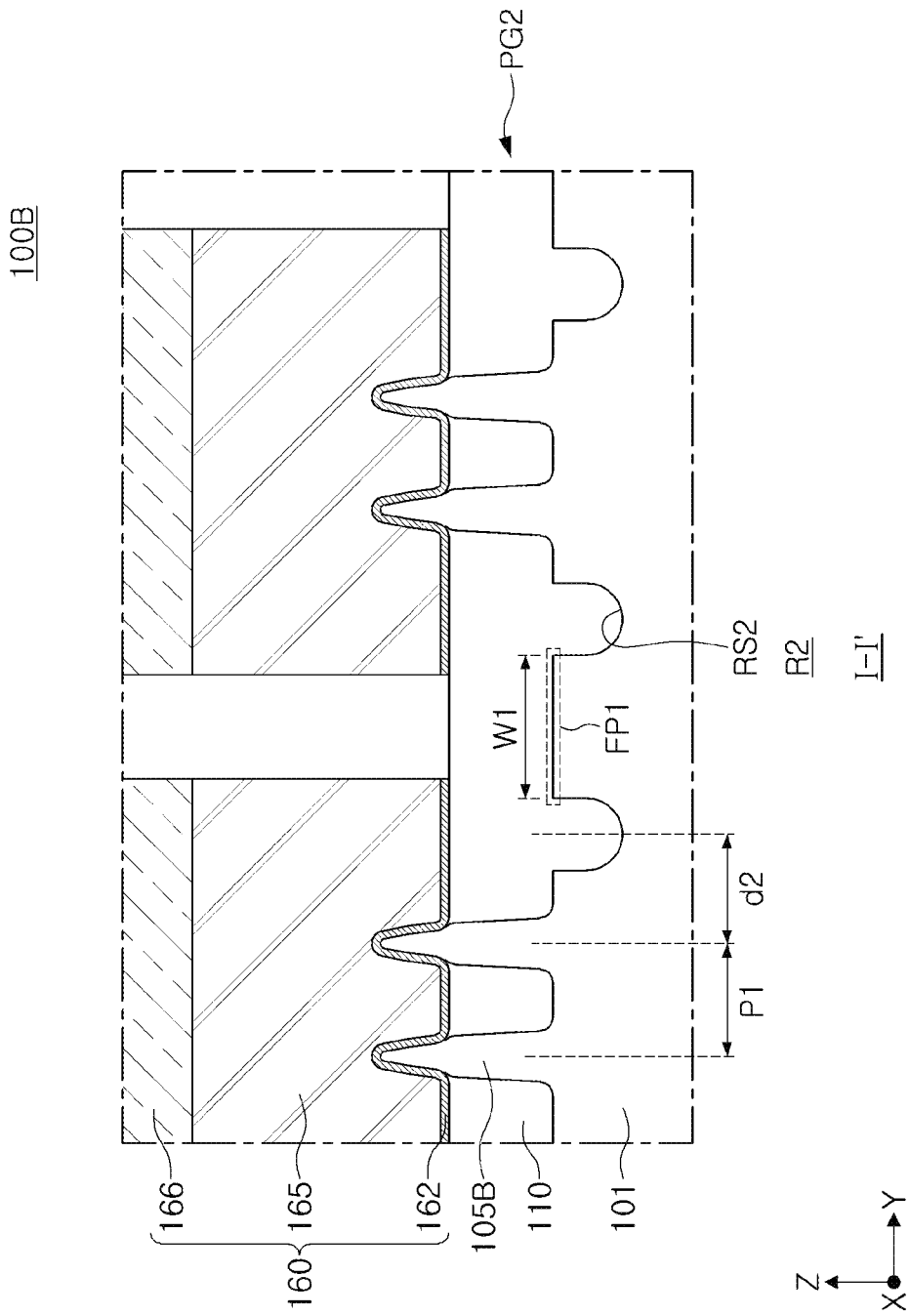
Figure 4C:
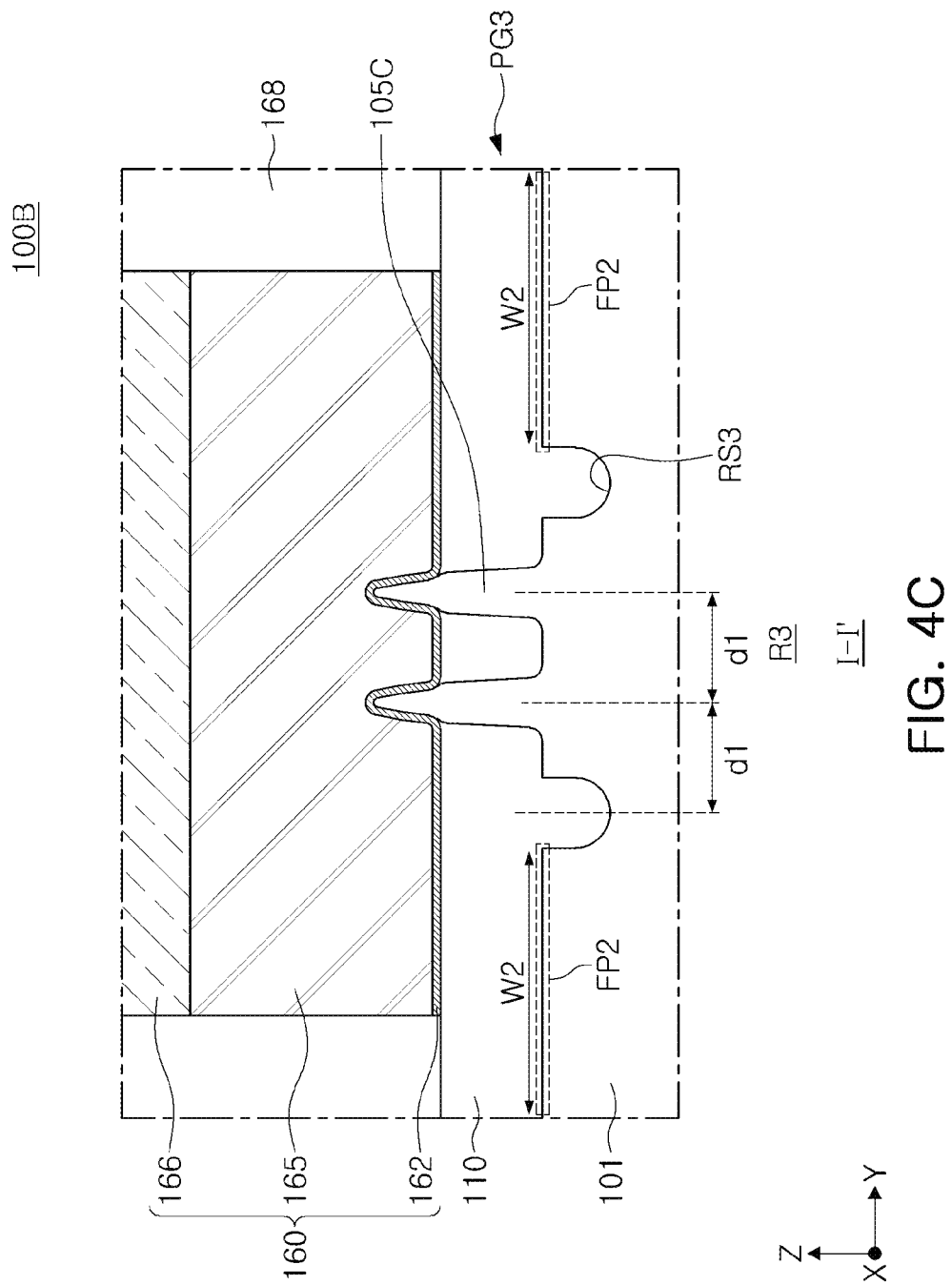

FIGS. 4A to 4C are cross-sectional diagrams illustrating a semiconductor device according to an example embodiment. FIG. 4A is an enlarged diagram illustrating a region corresponding to a first region R1 illustrated in FIG. 2A. FIG. 4B is an enlarged diagram illustrating a region corresponding to a first region R2 illustrated in FIG. 2A. FIG. 4C is an enlarged diagram illustrating a region corresponding to a third region R3 illustrated in FIG. 2A.

FIG. 4A illustrates example shapes of patterns of the first pattern group PG1 in the first region R1 of the substrate 101 of the semiconductor device 100B.

The lower ends of the first recess portions RS1 may be disposed at a level lower than a level of the lower ends of the first fin pattern 105A. The first recess portions RS1 may be partially recessed from the surface of the substrate 101 and may have a downwardly concave shape. The first recess portions RS1 may be configured as trenches which may be concave downwardly without sharp protrusions. The first recess portions RS1 may have a "U" shape or a shape similar to a "U" shape. The central axis of the first recess portions RS1 may be spaced apart from the central axis of the first fin pattern 105A by a first distance d1 in the second direction Y. The relationship between the first distance d1 and the minimum pitch P1 may be the same as described in the aforementioned example embodiment with reference to FIG. 3A.

A lower end of the recess portion RS1 may be disposed at a lower level by a third depth h3 from the upper end of the first fin pattern 105A. The lower end of the recess portion RS1 may be disposed at a level lower than a level of the upper surface of the device isolation layer 110 by a fourth depth h4. In an example embodiment, the third depth h3 may be greater than the first depth h1, and the fourth depth h4 may be greater than the second depth h2. In an example embodiment, the third depth h3 may be about 60 nm or more, about 60 nm or more and about 170 nm or less, for example. The third depth h3 may be, for example, about 60 nm or more and about 150 nm or less. The fourth depth h4 may be about 10 nm or more, for example, about 10 nm or more and about 120 nm or less. The fourth depth h4 may be, for example, about 10 nm or more and about 110 nm or less. When the first depth h3 and the fourth depth h4 are greater or less than the above-mentioned ranges, a dummy fin or a ghost fin may remain, such that electrical properties of the semiconductor device may be deteriorated.

FIG. 4B illustrates example shapes of patterns of the second pattern group PG2 in the second region R2 of the substrate 101 of the semiconductor device 100B.

The lower ends of the second recess portions RS2 may be disposed at a level lower than the surface of the first planar portion FP1. The second recess portions RS2 may be trenches which may be concave downwardly without sharp protrusions. Structures other than the shape of the second recess portions RS2 may be the same as in the aforementioned example embodiment described with reference to FIG. 3B.

FIG. 4C illustrates example shapes of patterns of the third pattern group PG3 in the third region R3 of the substrate 101 of the semiconductor device 100B.

The lower ends of the third recess portions RS3 may be disposed at a level lower than a level of the surface of the second planar portion FP2. The third recess portions RS3 may be configured as trenches which may be concave downwardly without sharp protrusions. Structures other than the shapes of the third recess portions RS3 may be the same as in the aforementioned example embodiment described with reference to FIG. 3C.

Figure 5:
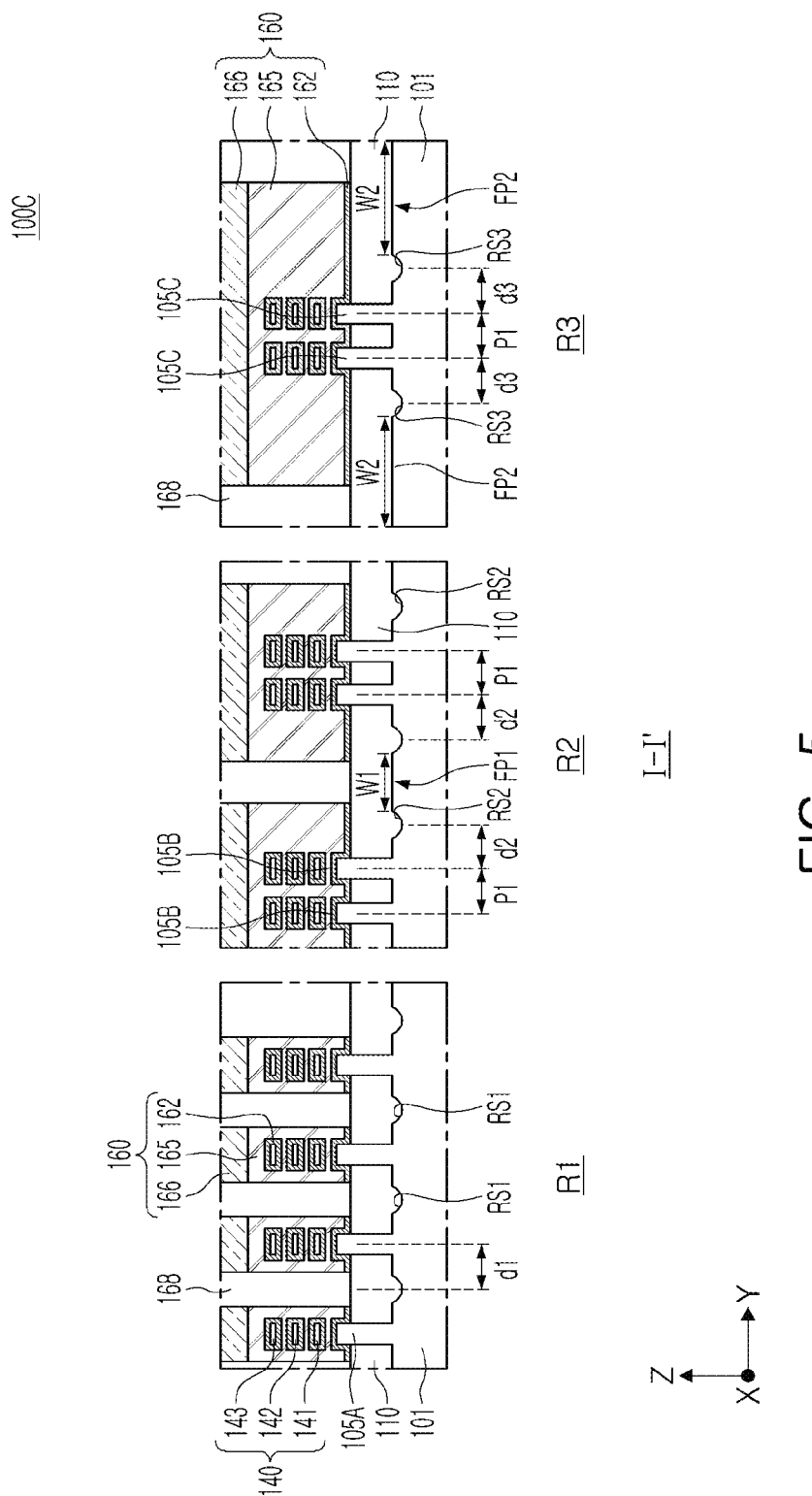
FIG. 5 is a cross-sectional diagram illustrating a semiconductor device according to an example embodiment of the present disclosure.

FIG. 5 is a cross-sectional diagram illustrating a semiconductor device according to an example embodiment, illustrating a region corresponding to FIG. 2A.

Referring to FIG. 5, a semiconductor device 100C may include fin patterns 105A, 105B, and 105C, channel structures 140 including a plurality of channel layers 141, 142, and 143, source/drain regions 130 (see FIG. 2B), and gate structures 160. The semiconductor device 100C may further include a device isolation layer 110, an interlayer insulating layer 170, and a contact structure 180. In the description below, only a structure different from that of the semiconductor device 100 illustrated in FIGS. 2A to 2C will be described.

In the semiconductor device 100C, the fin patterns 105A, 105B, and 105C may have a fin structure, and the gate electrodes 165 may be disposed between the fin patterns 105A, 105B, and 105C and the channel structures 140, among the plurality of channel layers 141, 142, and 143 of the channel structures 140, and in an upper portion of the channel structures 140. Accordingly, the semiconductor device 100C may include a multi bridge channel FET (MBCFET™) formed by the channel structures 140, the source/drain regions 130, and the gate electrodes 165.

The channel structures 140 may include first to third channel layers 141, 142, and 143, two or more channel layers spaced apart from each other in a direction perpendicular to the upper surfaces of the fin patterns 105A, 105B, and 105C, in the third direction z, on the fin patterns 105A, 105B, and 105C. The first to third channel layers 141, 142, and 143 may be connected to the source/drain regions 130 and may be spaced apart from the upper surfaces of the fin patterns 105A, 105B, and 105C. The first to third channel layers 141, 142, and 143 may be surrounded by the gate dielectric layer 162 and the gate electrode 165. The first to third channel layers 141, 142, and 143 may be formed of a semiconductor material, and may include at least one of silicon (Si), silicon germanium (SiGe), and germanium (Ge). The first to third channel layers 141, 142, and 143 may be formed of the same material as that of the substrate 101, for example. The number and shape of the channel layers 141, 142, and 143 included in a single channel structure 140 may be varied in example embodiments.

FIGS. 6A to 16 are cross-sectional diagram illustrating a method of manufacturing a semiconductor device according to an example embodiment. FIGS. 6A to 16 illustrate a method for removing unnecessary dummy patterns in a self-aligned quadruple patterning (SAQP) process. For example, a method of removing at least three dummy patterns arranged in order in a second direction Y in pattern groups in the second and third regions R2 and R3 is illustrated.

Figure 6A:
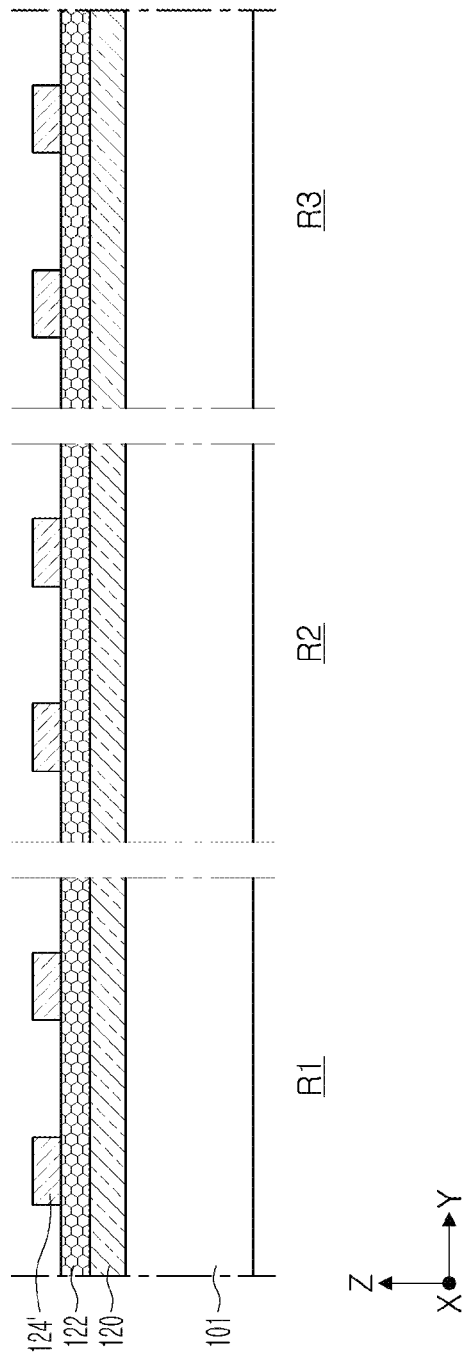

Referring to FIG. 6A, the mask layer 120, the first sacrificial layer 122, and the second sacrificial layer may be formed on the substrate 101, and the second sacrificial layer may be etched, thereby forming sacrificial patterns 124'.

The substrate 101 may be a semiconductor substrate such as a silicon wafer. The substrate 101 may be a silicon on insulator (SOI) substrate.

The mask layer 120 may be formed of a silicon-containing material such as silicon oxide ($SiO_x$), silicon oxynitride (SiON), silicon nitride ($Si_xN_y$), a carbon-containing material such as an amorphous carbon layer (ACL) or a spin-on hardmask (SOH), or a metal. For example, the mask layer 120 may include a plurality of layers.

The first sacrificial layer 122 and the second sacrificial layer may include one of polycrystalline silicon, an amorphous carbon layer (ACL), or a spin-on hardmask (SOH).

The mask layer 120, the first sacrificial layer 122 and the second sacrificial layer may be formed by atomic layer deposition (ALD), chemical vapor deposition (CVD), or a spin coating process, and a bake process or a curing process may be additionally performed depending on a material.

A photoresist (PR) may be formed on the second sacrificial layer, and linear shaped photoresist patterns may be formed through a photolithography process. The second sacrificial patterns 124' may be formed by anisotropically etching the second sacrificial layer using the photoresist patterns as an etching mask.

Figure 6B:
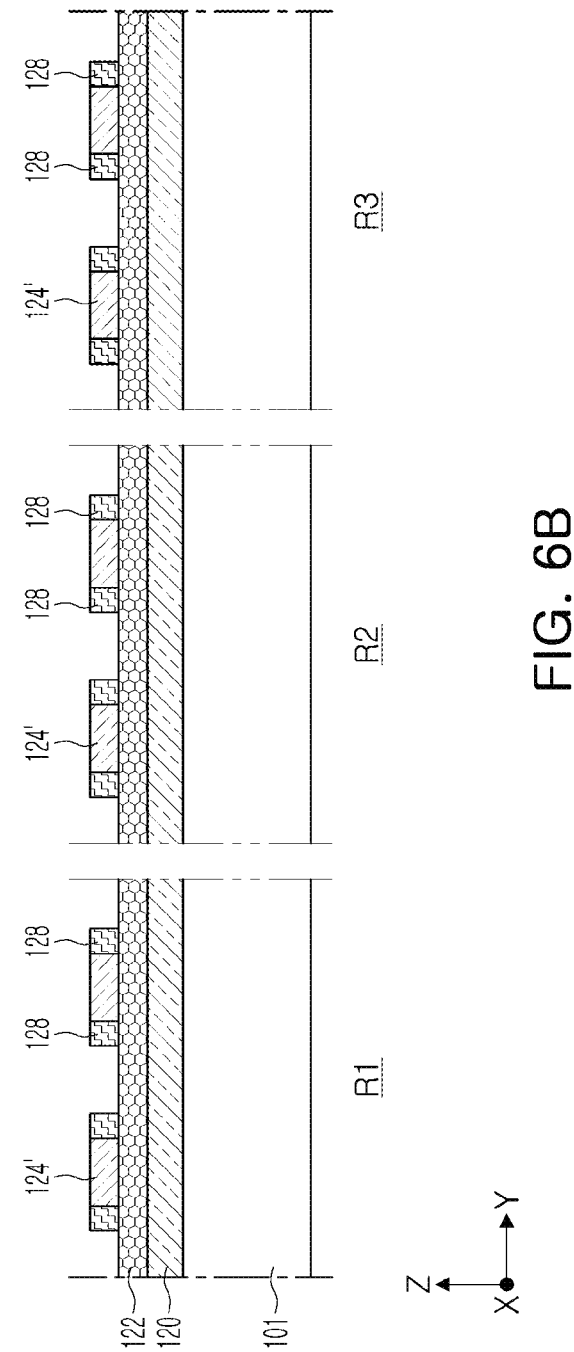

Referring to FIG. 6B, first spacers 128 may be formed on sidewalls of the second sacrificial patterns 124'.

A first spacer material layer conformally covering the second sacrificial patterns 124' may be formed, and an etch-back process may be performed, thereby forming first spacers 128 on sidewalls of the second sacrificial patterns 124'. By the etch-back process, sidewalls of the first spacers 128 may have a shape curved towards the second sacrificial patterns 124'.

The thickness of the first spacer material layer may be determined in consideration of a spacing or a pitch among fin patterns 105A, 105B, and 105C (see FIG. 1 or 2A) to be finally formed. The spacing or pitch between fin patterns to be finally formed may be narrower than a resolution limit of commercially available photolithography equipment.

The first spacer material layer may be formed of a material having etch selectivity with respect to a material of the second sacrificial patterns 124'. For example, when the second sacrificial patterns 124' are formed of one of polycrystalline silicon, an amorphous carbon layer (ACL), or spin-on hardmask (SOH), the first spacer material layer may be formed of silicon oxide or silicon nitride. The first spacer material layer may be formed by atomic layer deposition (ALD).

Referring to FIG. 6C, first spacers independently remaining on the first sacrificial layer 122 may be formed by selectively removing the second sacrificial patterns 124' with respect to the first spacers 128.

Referring to FIG. 6D, first sacrificial patterns 122' may be formed by etching the first sacrificial layer 122 using the first spacers 128 as etching masks. The mask layer 120 may be exposed while the first sacrificial patterns 122' are formed.

Figure 6E:
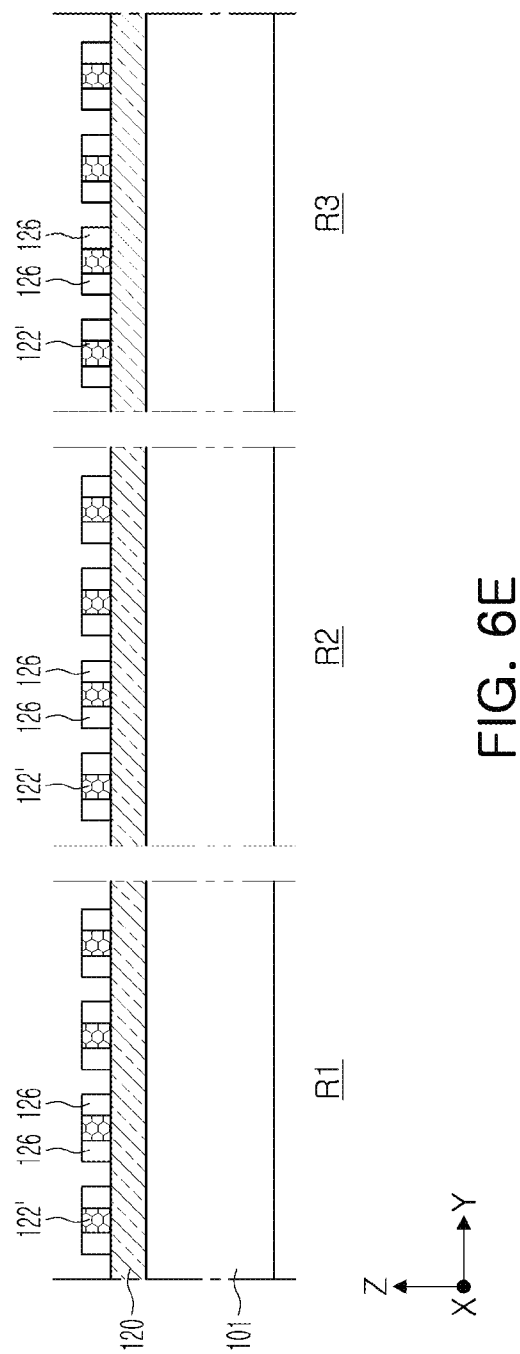

Referring to FIG. 6E, second spacers 126 may be formed on sidewalls of the first sacrificial patterns 122'. The first spacers 128 may be removed.

A second spacer material layer conformally covering the first sacrificial patterns 122' may be formed and an etch-back process may be performed, thereby forming second spacers 126 on the sidewalls of the first sacrificial patterns 122'.

The thickness of the second spacer material layer, which is, a width of the second spacers 126, may be determined in consideration of the width Fw of the fin patterns 105A, 105B, and 105C to be finally formed. The width of the fin patterns 105A, 105B, and 105C to be finally formed may be narrower than a resolution limit of commercially available photolithography equipment.

The second spacer material layer may be formed of a material having etch selectivity with respect to a material of the first sacrificial patterns 122'. For example, when the first sacrificial patterns 122' are formed of one of polycrystalline silicon, an amorphous carbon layer (ACL), or spin-on hardmask (SOH), the second spacer material layer may be formed of silicon oxide or silicon nitride. The second spacer material layer may be formed by atomic layer deposition (ALD).

Figure 6F:
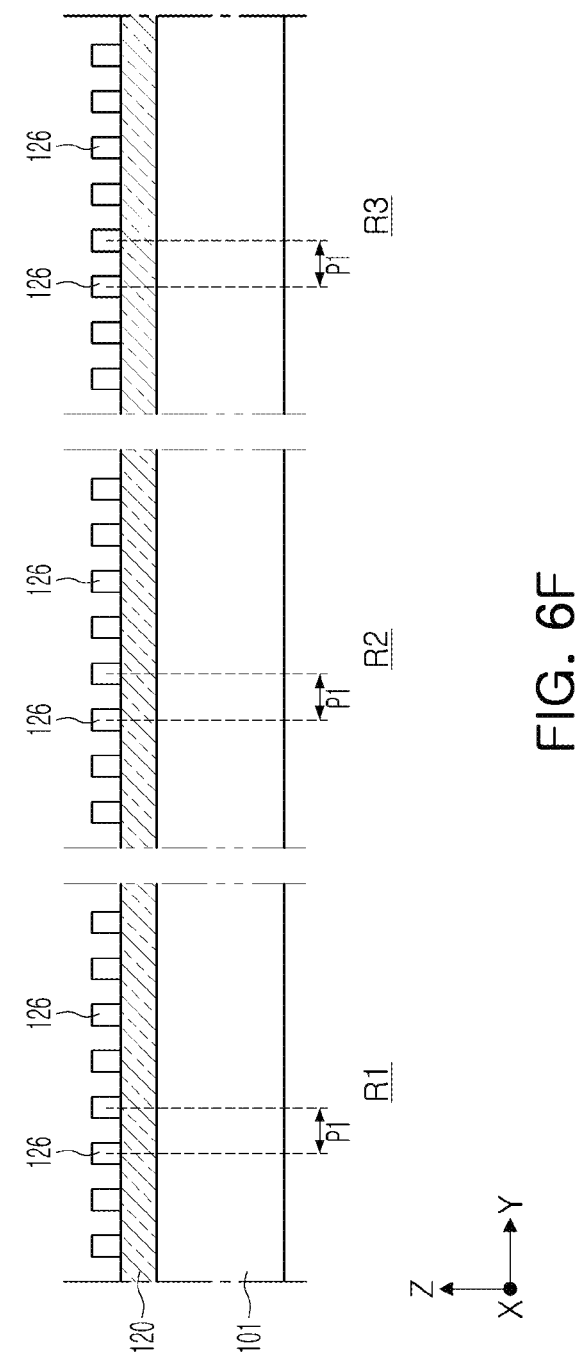

Referring to FIG. 6F, by selectively removing the first sacrificial patterns 122' with respect to the second spacers 126, second spacers 126 independently remaining on the mask layer 120 may be formed.

Figure 6G:
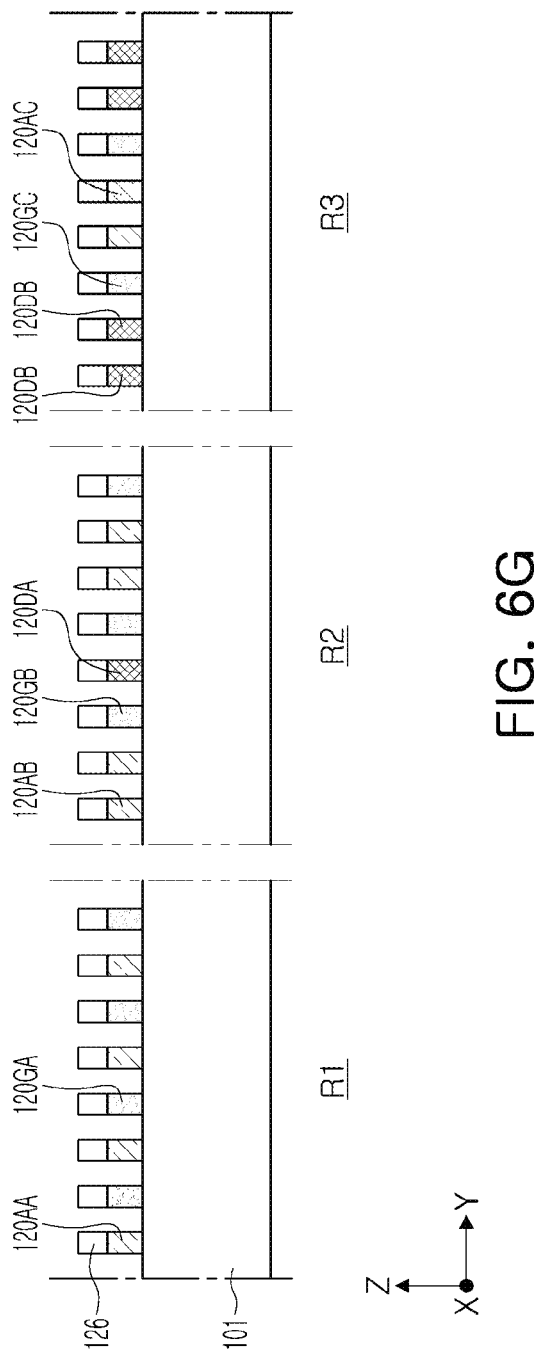

Referring to FIG. 6G, mask patterns may be formed by etching the mask layer 120 using the second spacers 126 as etching masks.

The mask patterns may be formed in positions corresponding to the second spacers 126. The mask patterns may correspond to a fin pattern to be used and an unnecessary dummy pattern in a single pattern group.

In the first region R1, first mask patterns 120AA for forming first fin patterns 105A (in FIG. 9A) may be formed, and first guard mask patterns 120GA for forming first guard fin patterns 105GA (in FIG. 9A) may be formed.

In the second region R2, second mask patterns 120AB for forming second fin patterns 105B (in FIG. 9A) may be formed, second guard mask patterns 120GB for forming the second guard fin patterns 105 GB (in FIG. 9A) may be formed, and a first dummy mask pattern 120DA removed before the fin pattern is formed may be formed.

In the third region R3, third mask patterns 120AC for forming third fin patterns 105C (in FIG. 9A) may be formed, third guard mask patterns 120GC for forming third guard fin patterns 105GC (in FIG. 9A) may be formed, and second dummy mask patterns 120DB removed before the fin pattern is formed may be formed.

Referring to FIG. 7A, a first material layer 112 may be formed, and a first photoresist pattern P10 having a first opening OP1 may be formed on the first material layer 112.

Referring to FIG. 7B, a portion of the first material layer 112 may be removed through the first opening OP1 of the first photoresist pattern P10, and the mask patterns 120' and the second spacers 126 may be partially removed in the second region R2 and the third region R3.

The first material layer 112 may be formed to cover the surface of the substrate 101 and to fill a region among the mask patterns 120AA, 120GA, 120AB, 120GB, 120DA, 120AC, 120GB, and 120DB. The first material layer 112 may be formed to fill a region between the second spacers 126 and to cover the upper surfaces of the second spacers 126. The first photoresist pattern P10 may be formed on the first material layer 112.

The mask patterns 120DA and 120DB and the second spacers 126 removed from the second region R2 and the third region R3 may be patterns corresponding to positions in which the planar portions FP1 and FP2 illustrated in FIG. 2A are formed. A position of the first opening OP1 may correspond to a region of each of the pattern groups in which fin patterns are not formed.

In this process, the first width W1 and the second width W2 of the planar portions FP1 and FP2 in the second and third regions R2 and R3 may be determined according to the number of mask patterns removed through the first opening OP1.

Figure 8:
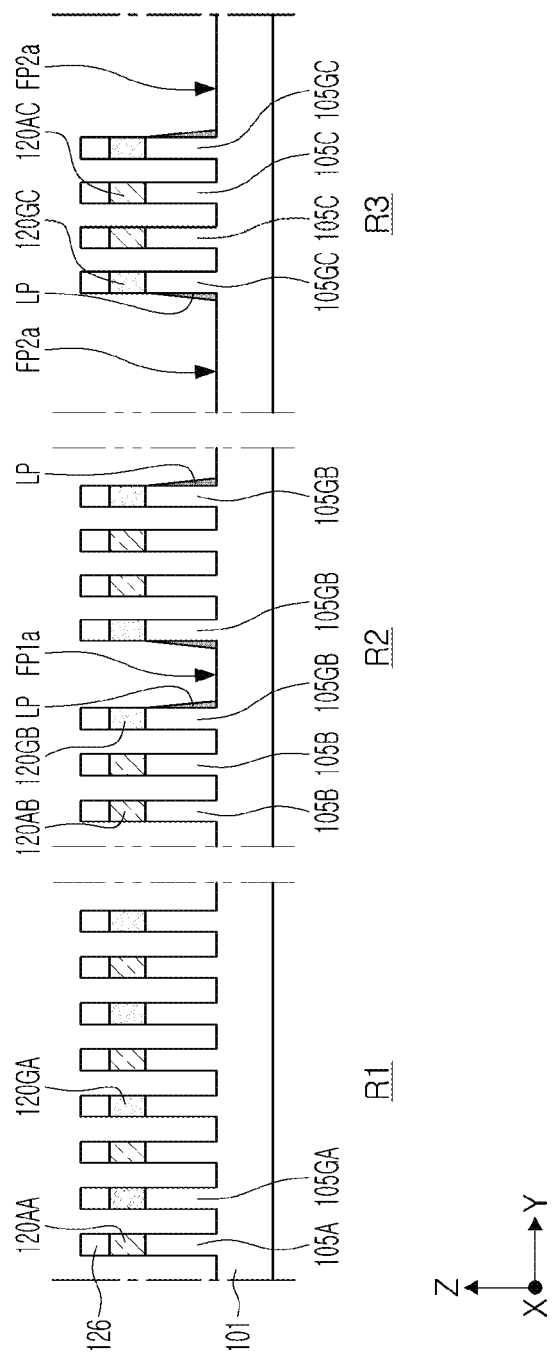

Referring to FIG. 8, by anisotropically etching the substrate 101 using mask patterns 120AA, 120GA, 120AB, 120GB, 120AC, and 120GB as etching masks, the first fin patterns 105A and the first guard fin patterns 105GA may be formed on the first region R1 of the substrate 101, the second fin patterns 105B and the second guard fin patterns 105GB may be formed on the second region R2, and the third fin patterns 105C and the third guard fin patterns 105GC may be formed on the third region R3.

In the first to third fin patterns 105A, 105B, and 105C, a channel region surrounded by the gate electrode 165 (see FIG. 2B) in the semiconductor device 100 may be formed. The first to third guard fin patterns 105GA, 105GB, and 105GC may be dummy patterns disposed adjacent to the first to third fin patterns 105A, 105B, and 105C and including etching residues LP deposited on sidewalls thereof by etch loading caused by a difference in the gap between the patterns. Since the first to third guard fin patterns 105GA, 105GB, and 105GC of which widths have changed due to the etching loading are removed in a subsequent process, the fin patterns 105A, 105B, and 105C that finally remain may have a uniform size (or a width).

In this process, first and second preliminary planar portions FP1a and FP2a may be formed on the surface of the substrate 101 corresponding to the removed mask patterns 120DA and 120DB.

Figure 9A:
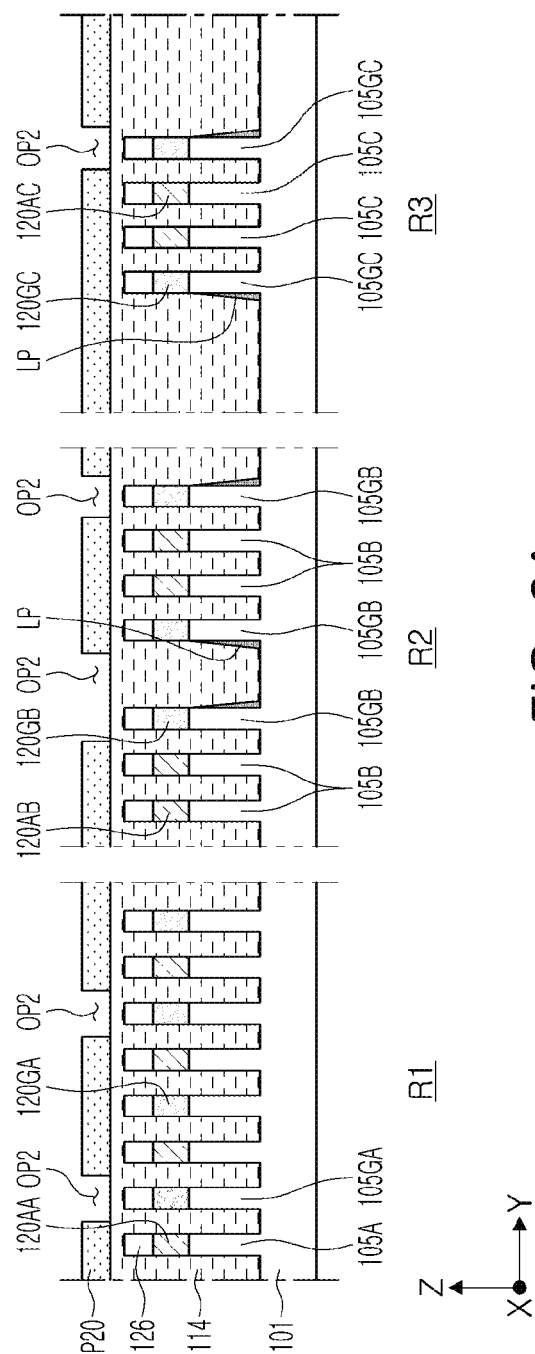

Referring to FIG. 9A, a second material layer 114 may be formed, and a second photoresist pattern P20 having a second opening OP2 may be formed on the second material layer 114.

Figure 9B:
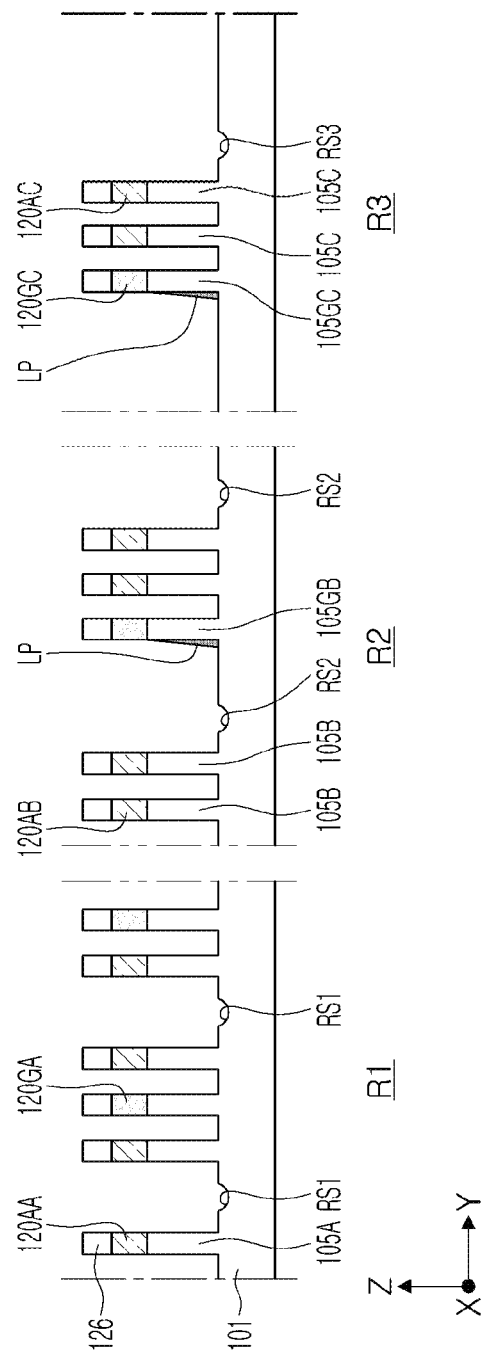

Referring to FIG. 9B, a portion of the second material layer 114 may be removed through the second opening OP2 of the second photoresist pattern P20, and a portion of the first to third guard fin patterns 105GA, 105GB, and 105GC may be removed.

The second material layer 114 may be partially removed from an upper portion in a position corresponding to the second opening OP2. As the second material layer 114 is partially removed, a portion of the first to third guard fin patterns 105GA, 105GB, and 105GC may be exposed. The second spacers 126 and the mask patterns 120GA, 120GB, and 120GC corresponding to the second opening OP2 may be removed, and the exposed first to third guard fin patterns 105GA, 105GB, and 105GC may be removed from the upper portion. Accordingly, a portion of the first to third recess portions RS1, RS2, and RS3 may be formed in the first to third regions R1, R2, and R3.

Figure 10A:
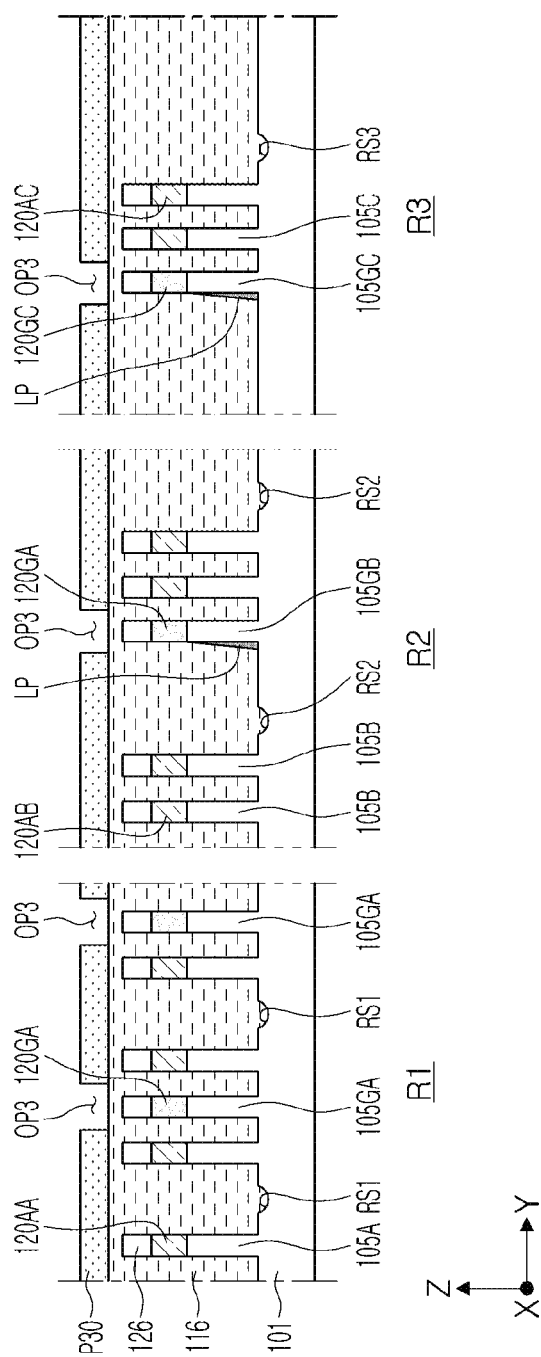

Referring to FIG. 10A, a third material layer 116 may be formed, and a third photoresist pattern P30 having a third opening OP3 may be formed on the third material layer 116.

Figure 10B:
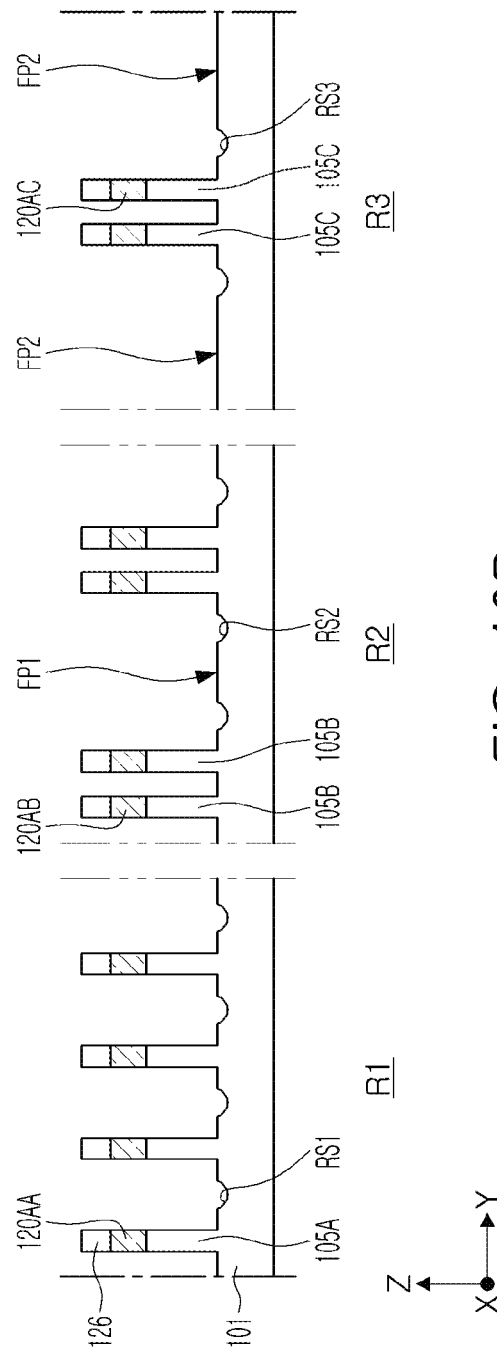

Referring to FIG. 10B, a portion of the third material layer 116 may be removed through the third photoresist pattern P30, and the other first to third guard fin patterns 105GA, 105GB, and 105GC may be removed.

The third material layer 116 may be partially removed from an upper portion in a position corresponding to the third opening OP3. A portion of the third material layer 116 may be removed, such that a portion of the remaining first to third guard fin patterns 105GA, 105GB, and 105GC may be exposed. The second spacers 126 and the mask patterns 120GA, 120GB, and 120GC corresponding to the third opening OP3 may be removed, and the remaining exposed first to third guard fin patterns 105GA, 105GB, and 105GC may be removed from an upper portion. Accordingly, as illustrated in FIG. 2A, the first to third recess portions RS1, RS3, and RS3 may be formed in the first to third regions R1, R2, and R3, and the first and second planar portions FP1 and FP2 may be formed.

Referring to FIGS. 11A and 11B, instead of the processes described with reference to FIGS. 9A to 10B, a first material layer 112a may be formed, a first photoresist pattern P10a having openings OP1a, OP2a, and OP3a may be formed, the first material layer 112a may be partially removed, and the first to third guard fin patterns 105GA, 105GB, and 105GC may be removed in the same manufacturing process.

Figure 12A:
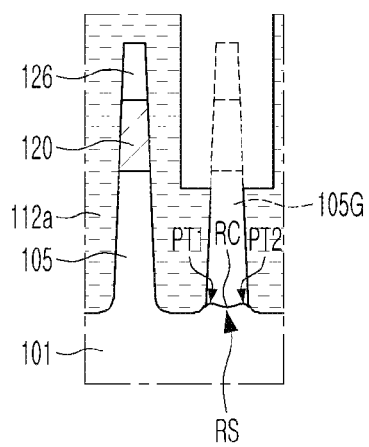
Figure 12B:
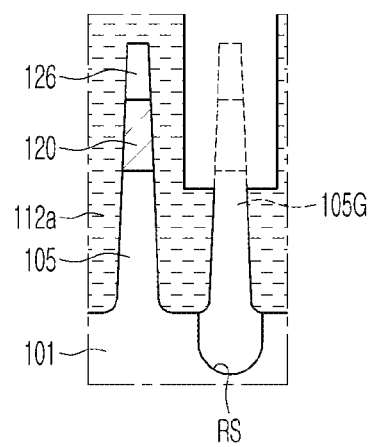

FIGS. 12A and 12B illustrate a process in which the guard fin patterns are removed from the first to third regions R1, R2, and R3 through the processes described with reference to FIGS. 9A to 10B in greater detail. FIG. 12 is an enlarged diagram illustrating portion indicated "A" illustrated in FIG. 11B, and illustrates a process of removing a guard fin pattern between a fin pattern 105 and a guard fin pattern 105G adjacent to each other.

Referring to FIG. 12A, the guard fin pattern 105G may be removed from the upper portion, such that a double-humped-shaped recess portion RS may be formed in the lower portion. The recess portion RS may include protrusions PT1 and PT2 protruding upwardly and a recessed concave portion RC between the protruding portions.

When the dummy fin is removed by a deep trench isolation process, since the insulating layer including a material such as silicon oxide and the dummy fin including a material such as silicon are removed together, the dummy fin may remain in the removed region in the shape of a sharp protrusion. To limit and/or prevent the fins having the sharp protrusion from remaining by the deep trench isolation process, a trench may be formed to have a desired and/or alternatively predetermined depth or more. According to the example embodiment, since the recess portion RS is formed by selectively removing only the guard fin patterns as described with reference to FIGS. 9A to 10B, the recess portion RS may remain as a double-humped-shaped pattern having a curved surface, rather than a upwardly sharp pattern.

Referring to FIG. 12B, the guard fin pattern 105G may be removed from the upper portion, such that a recess portion RS concave downwardly from the surface of the substrate 101 may be formed. The recess portion RS may be a trench which may be concave downwardly without a sharp protrusion. The depth of the recess portion RS may be relatively smaller than the depth of a recess formed by deep trench isolation. For example, the recess portion RS may be formed to a depth of about 10 nm or more and about 60 nm or less from an upper end of the fin pattern 105. Since the adjacent fin patterns 105 may be isolated without deeply forming the recess portion RS, the inclination of the fin patterns 105 may be reduced.

Figure 13:
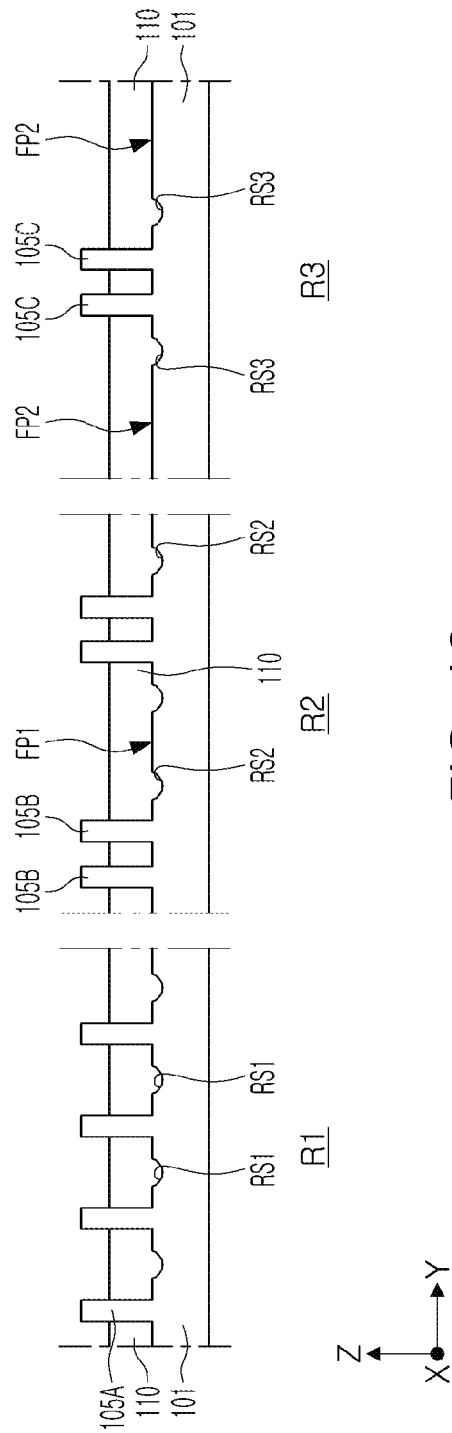

Referring to FIG. 13, the device isolation layer 110 may be formed such that upper portions of the fin patterns 105A, 105B, and 105C may protrude.

A space between the first to third fin patterns 105A, 105B, and 105C may be filled with the device isolation layer 110. The mask patterns 120' remaining on the first to third fin patterns 105A, 105B, and 105C may be removed, and a portion of the device isolation layer 110 may be etched to a desired and/or alternatively predetermined depth such that the upper portions of the first to third fin patterns 105A, 105B, and 105C may protrude.

Figure 14:
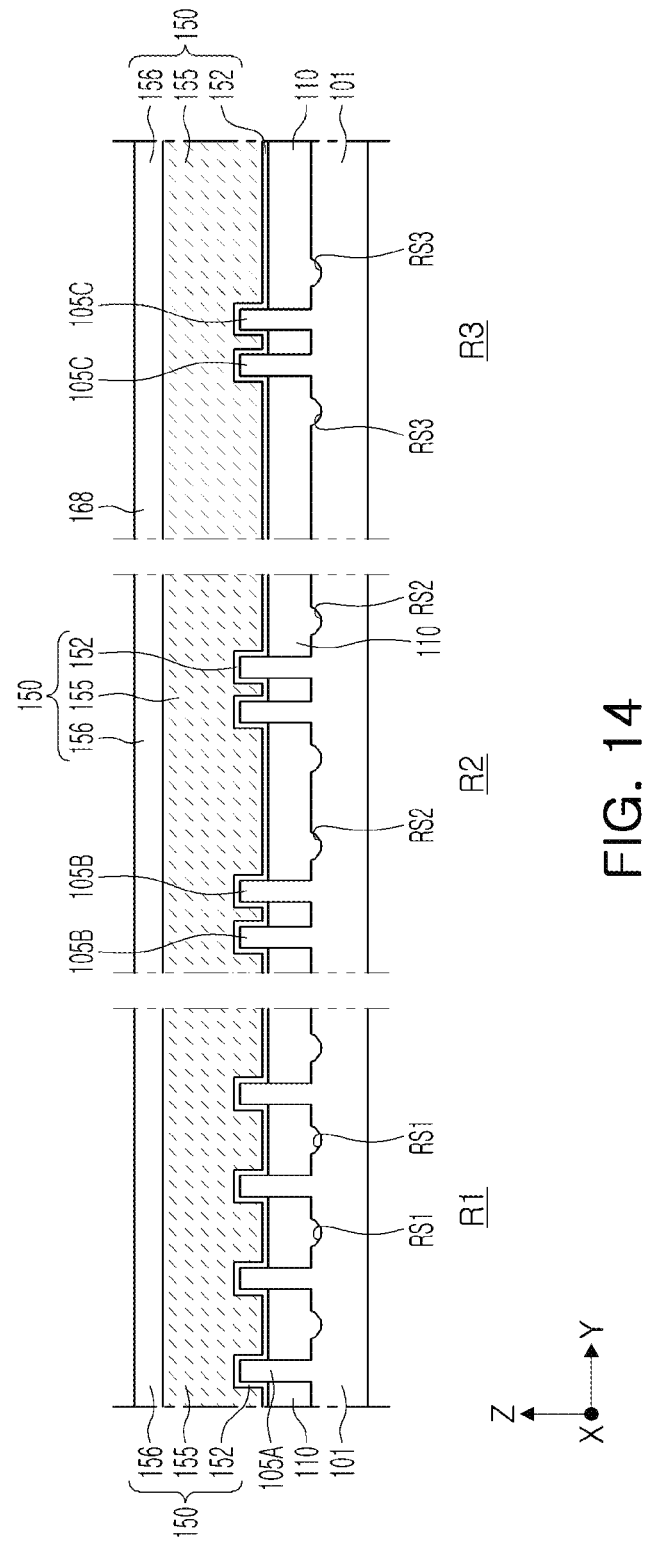

Referring to FIG. 14, sacrificial gate structures 150 intersecting the fin patterns 105A, 105B, and 105C may be formed.

The sacrificial gate structures 150 may be formed in a region in which the gate dielectric layer 162, the gate electrode 165, and the gate capping layer 166 are disposed as illustrated in FIGS. 2B and 2C through a subsequent process. Each of the sacrificial gate structures 150 may include a sacrificial gate insulating layer 152, a sacrificial gate electrode 155, and a sacrificial gate capping layer 156. The sacrificial gate insulating layer 152 and the sacrificial gate capping layer 156 may be insulating layers, and the sacrificial gate electrode 155 may be a conductive layer, but an example embodiment thereof is not limited thereto. Spacer layers 164 may be disposed on both sides of the sacrificial gate structures 150.

Figure 15:
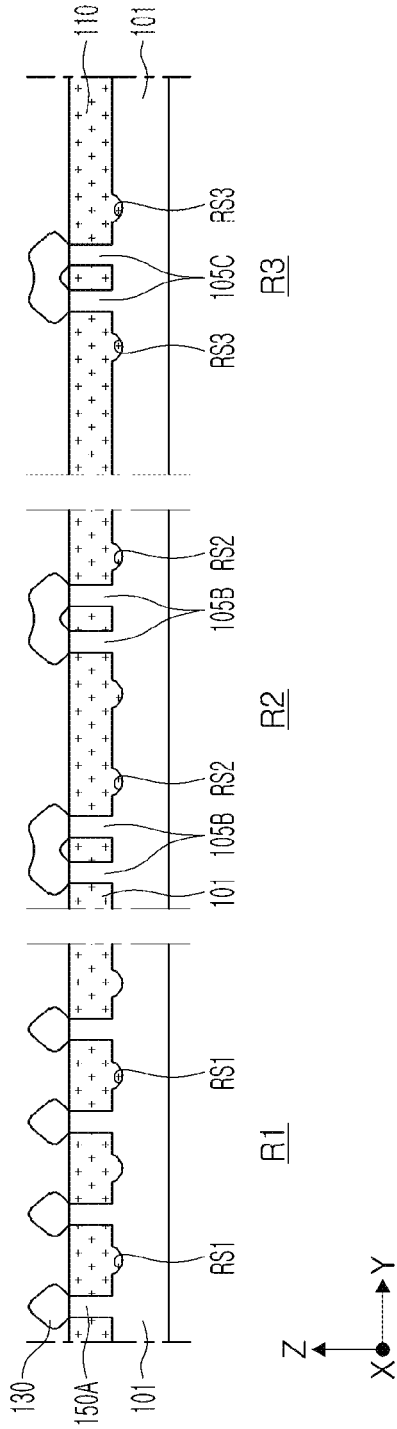

Referring to FIG. 15, the fin patterns 105A, 105B, and 105C may be partially recessed into on both sides of the sacrificial gate structures 150, and the source/drain regions 130 may be formed.

The source/drain regions 130 may be formed on the fin patterns 105A, 105B, and 105C which may be recessed after the fin patterns 105A, 105B, and 105C are partially removed from both sides of the sacrificial gate structures 150. The source/drain regions 130 may be formed using, for example, a selective epitaxial growth process. The source/drain regions 130 may include a semiconductor material doped with impurities, Si, SiGe, or SiC, for example. The impurities may be doped in-situ which the source/drain regions 130 is formed or may be separately implanted after growth.

After the source/drain regions 130 are formed, an interlayer insulating layer 170 may be formed. The interlayer insulating layer 170 may be formed by depositing an insulating material to cover the sacrificial gate structure 150 and the source/drain regions 130, and exposing the upper surface of the sacrificial gate structure 150 through a planarization process.

Figure 16:
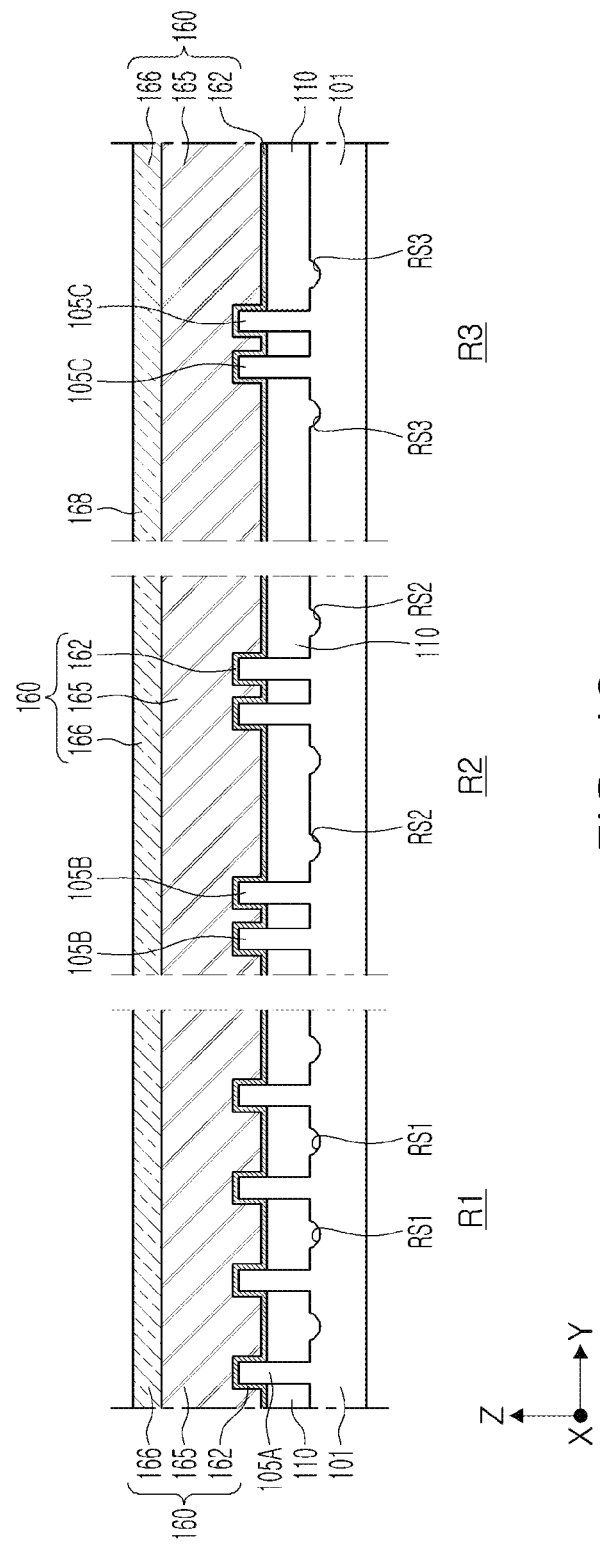

Referring to FIG. 16, the sacrificial gate structures 150 may be removed, and the gate structures 160 may be formed.

The sacrificial gate structures 150 may be selectively removed with respect to the fin patterns 105A, 105B, and 105C. The sacrificial gate structures 150 may be removed using at least one of a dry etching process and a wet etching process. Openings may be formed in a region from which the sacrificial gate structures 150 are removed.

The gate dielectric layer 162, the gate electrode 165, and the gate capping layer 166 may be sequentially formed to fill the openings. The gate dielectric layer 162 may be formed substantially conformally along sidewalls and lower surfaces of the openings. The gate electrode 165 may be formed of a plurality of conductive material layers.

Thereafter, referring to FIGS. 2A to 2C, a gate isolation pattern 168 may be formed, and contact structures 180 may be formed.

In the example embodiment, it has been described that the gate isolation pattern 168 may be formed after the gate electrode 165 is formed, but in the process of forming the sacrificial gate structure 150, the gate isolation pattern 168 may be firstly formed, and the sacrificial gate structure 150 may be removed, thereby forming the gate structures 160. In this case, the gate dielectric layer 162 may be disposed to extend along the sidewall of the gate isolation pattern 168.

FIGS. 17A to 19B are cross-sectional diagrams illustrating a method of manufacturing a semiconductor device according to example embodiments. FIGS. 17A to 19B illustrate a method for removing unnecessary dummy patterns in a self-aligned double patterning (SADP) process. For example, a method of removing at least two dummy patterns arranged in order in the second direction Y from pattern groups in the second and third regions R2 and R3 is provided.

Figure 17A:
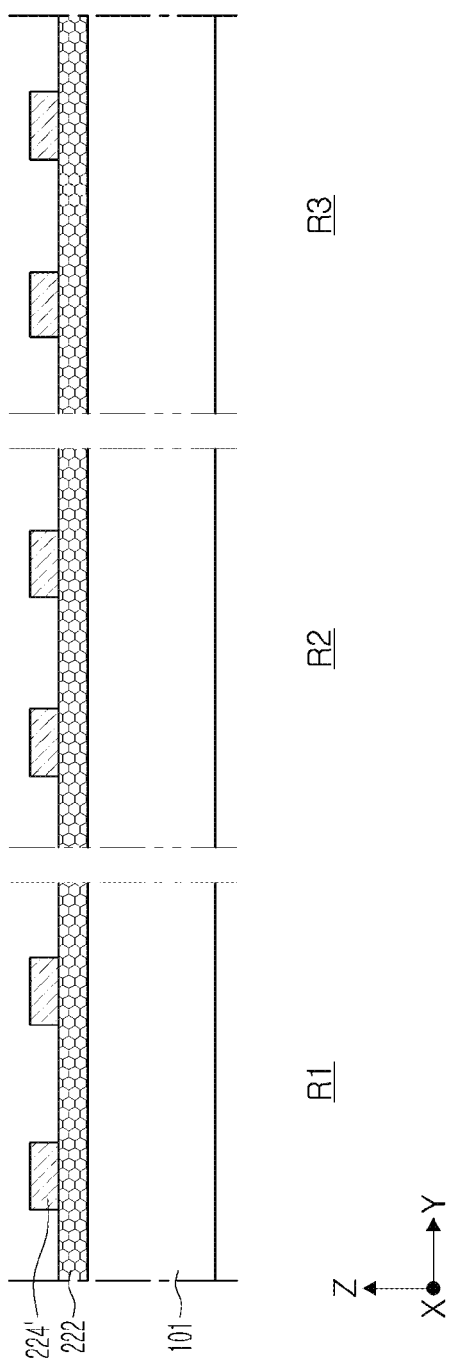

Referring to FIG. 17A, a first sacrificial layer 222 and a second sacrificial layer may be formed on a substrate 101, and the second sacrificial layer may be etched, thereby forming the second sacrificial patterns 224'.

The first sacrificial layer 222 and the second sacrificial layer may be formed of silicon-containing materials such as silicon oxide (SiOx), silicon oxynitride (SiON), silicon nitride ($Si_xN_y$), or polycrystalline silicon, a carbon-containing material such as an amorphous carbon layer (ACL) or spin-on hardmask (SOH), or metal.

A photoresist may be formed on the second sacrificial layer, and linear-shaped photoresist patterns may be formed through a photolithography process. The second sacrificial patterns 224' may be formed by anisotropically etching the second sacrificial layer using the photoresist patterns as an etching mask.

Figure 17B:
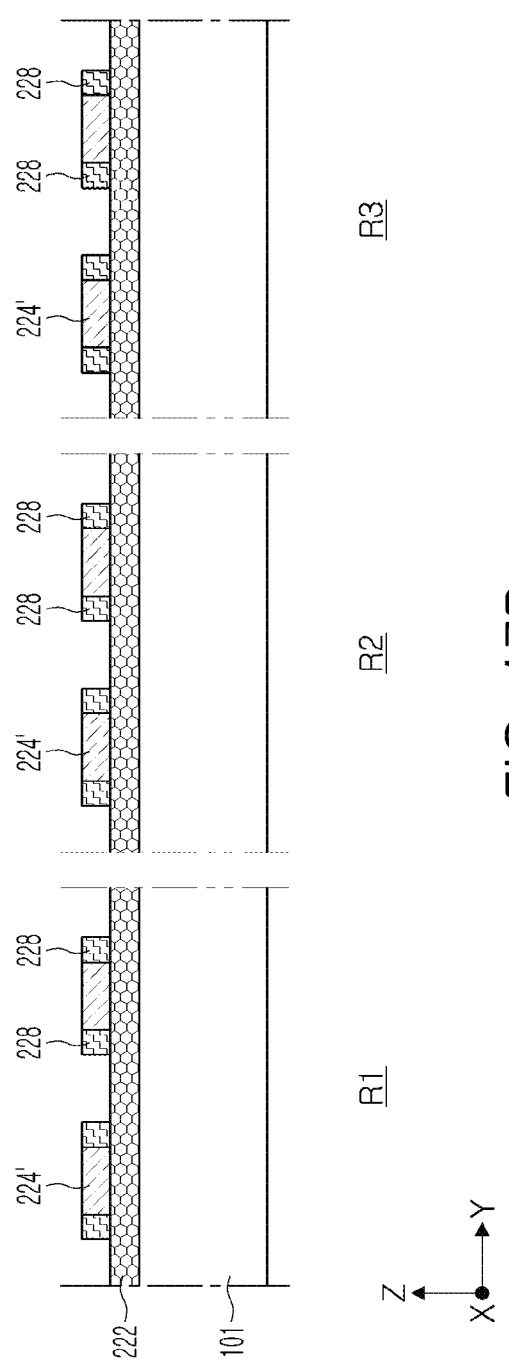

Referring to FIG. 17B, first spacers 228 may be formed on sidewalls of the second sacrificial patterns 224'. The forming the first spacers 228 may be the same as forming the first spacers 128 described with reference to FIG. 6B. Sidewalls of the first spacers 228 may have a shape curved towards the second sacrificial patterns 224' by an etch-back process.

Figure 17C:
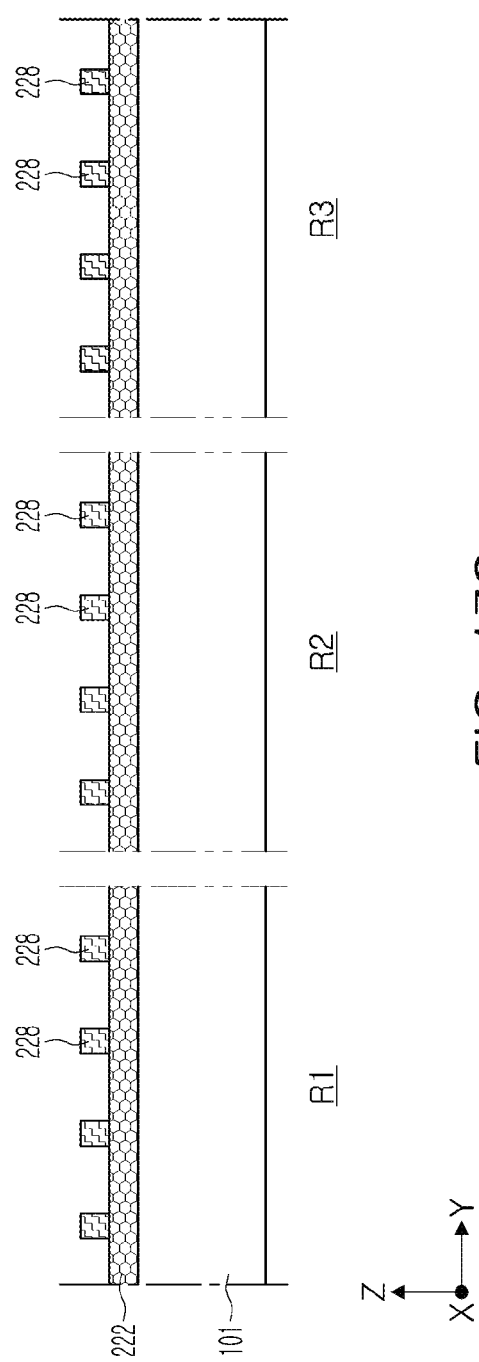

Referring to FIG. 17C, first spacers independently remaining on the first sacrificial layer 222 may be formed by selectively removing the second sacrificial patterns 224' with respect to the first spacers 228.

Figure 17D:
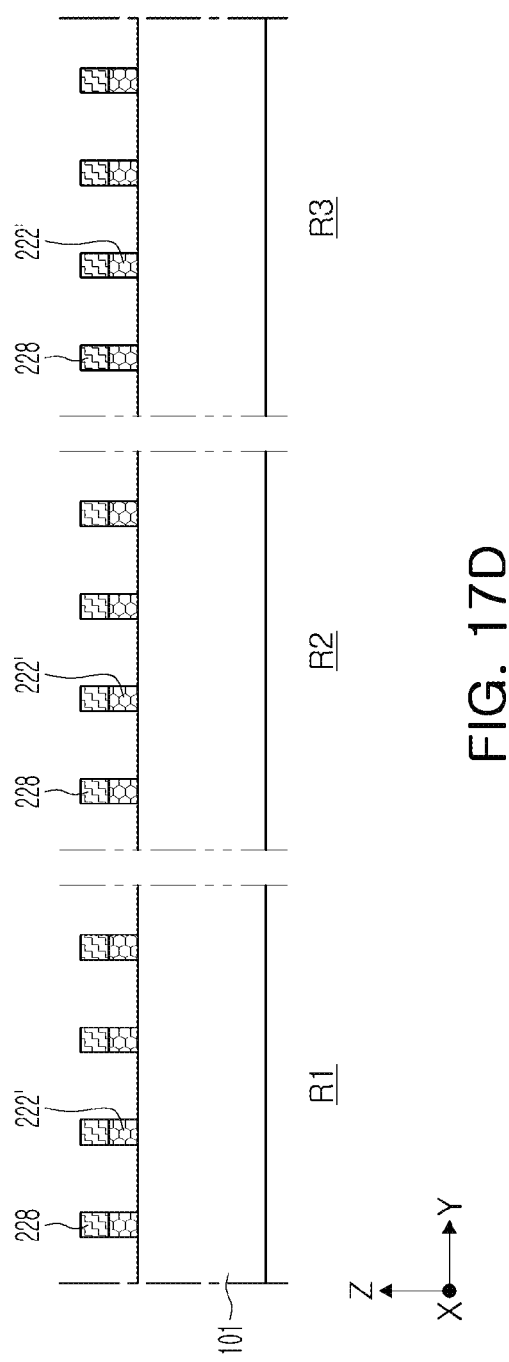

Referring to FIG. 17D, first sacrificial patterns 222' may be formed by etching the first sacrificial layer 222 using the first spacers 228 as an etching mask.

Referring to FIG. 18A, a first material layer 212 may be formed, and a first photoresist pattern P12 having a first opening OPa may be formed on the first material layer 212.

Referring to FIG. 18B, a portion of the first material layer 212 may be removed through the first opening OPa of the first photoresist pattern P12, and the first sacrificial patterns 222' and the second sacrificial patterns 224' may be partially removed from the second region R2 and the third region R3.

In this process, widths of the planar portions in the second and third regions R2 and R3 may be determined according to the number of the first sacrificial patterns 222' removed through the first opening OPa.

Figure 19:
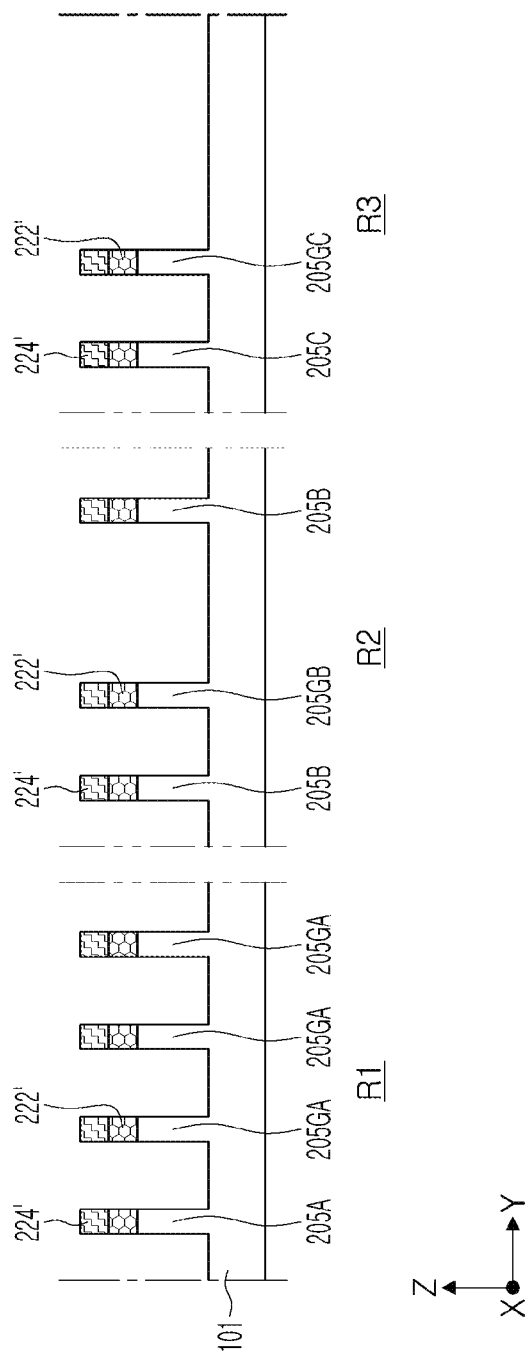

Referring to FIG. 19, by anisotropically etching the substrate 101 using the first sacrificial patterns 222' as an etching mask, first fin patterns 205A and first guard fin patterns 205GA may be formed on the first region R1 of the substrate 101, second fin patterns 205B and second guard fin patterns 205GB may be formed on the second region R2, and third fin patterns 205C and third guard fin patterns 205GC may be formed on the third region R3.

The first to third guard fin patterns 205GA, 205GB, and 205GC may be disposed adjacent to the first to third fin patterns 205A, 205B, and 205C, respectively, and may be dummy patterns, on sidewalls of which etching residues may be deposited by etching loading caused by a difference in the gap between the patterns. Since the first to third guard fin patterns 205GA, 205GB, and 205GC of which widths have changed due to etching loading are removed in a subsequent process, the fin patterns 205A, 205B, and 205C remaining finally may have a uniform size (or width).

Figure 20A:
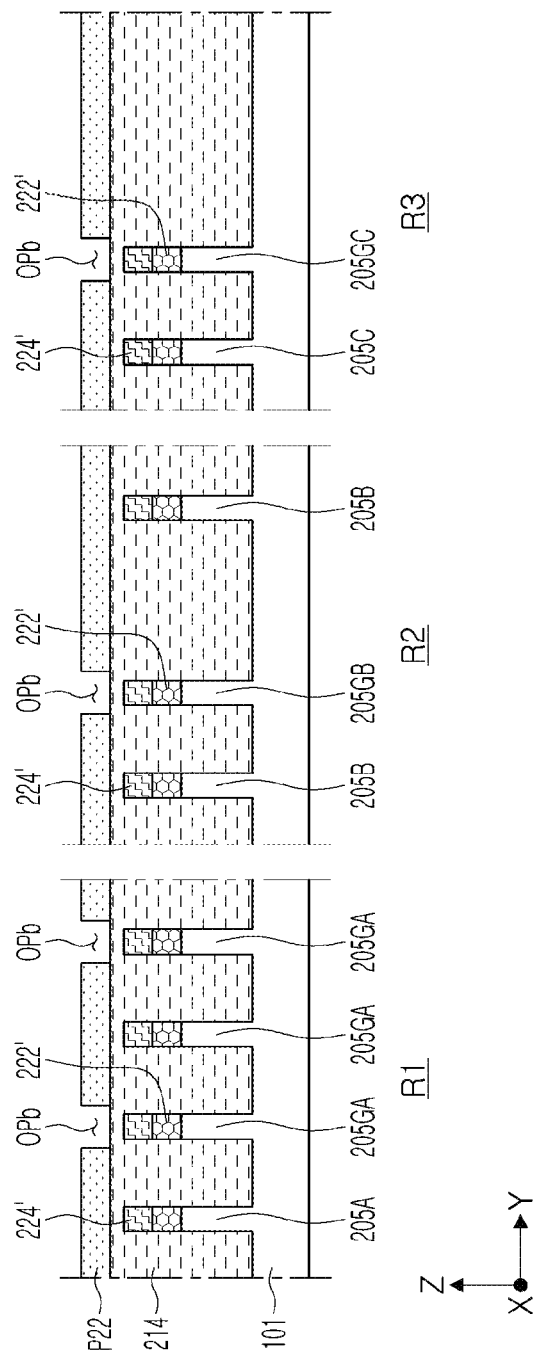

Referring to FIG. 20A, a second material layer 224 may be formed, and a second photoresist pattern P22 having a second opening OPb may be formed on the second material layer 224.

Figure 20B:
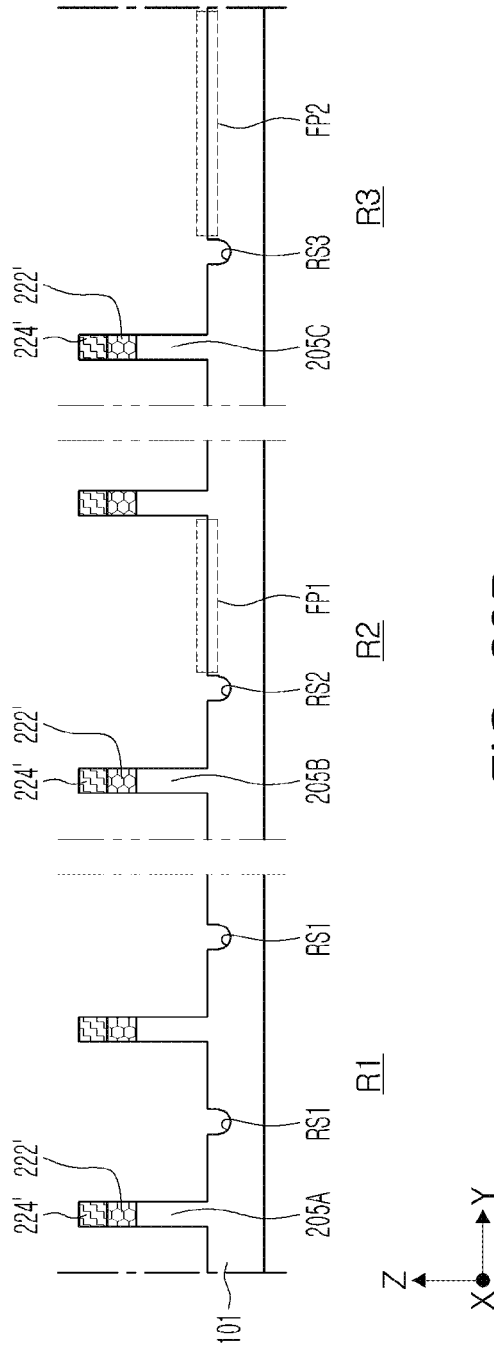

Referring to FIG. 20B, a portion of the second material layer 224 may be removed through the second opening OPb of the second photoresist pattern P22, and the first to third guard fin patterns 205GA, 205GB, and 205GC may be removed.

The first to third guard fin patterns 205GA, 205GB, and 205GC may be exposed from the second material layer 224 in a position corresponding to the second opening OPb, and the first to third guard fin patterns 205GA, 205GB, and 205GC may be removed, thereby forming the first to third recess portions RS1, RS2, and RS3 in the first to third regions R1, R2, and R3. The shapes of the first to third recess portions RS1, RS2, and RS3 may have the shape of the recess portions RS illustrated in FIG. 12A or 12B.

As described with reference to FIGS. 13 to 16, the device isolation layer 110, the source/drain regions 130, and the gate structures 160 may be formed. Thereafter, the gate isolation pattern 168 and the contact structures 180 may be formed.

The example embodiment may also be applied to a vertical FET in which an active region extending vertically to the upper surface of the substrate 101 and a gate structure surrounding the active region, or to a negative capacitance FET (NCFET) using a gate insulating film having ferroelectric properties.

According to the aforementioned example embodiments, a semiconductor device including fine patterns having a uniform size in a single pattern group and a method of manufacturing the same may be provided. Accordingly, a semiconductor device having improved reliability may be manufactured.

While the example embodiments have been illustrated and described above, it will be apparent to those skilled in the art that modifications and variations could be made without departing from the scope of the present disclosure as defined by the appended claims.

What is claimed is:

1. A method for manufacturing a semiconductor device comprising:
    forming a mask layer on a substrate;
    forming spacers spaced apart from each other on the mask layer;
    forming mask patterns by etching the mask layer using the spacers as an etching mask, the mask patterns including fin mask patterns, guard mask patterns, and dummy mask patterns;
    removing the dummy mask patterns;
    forming fin patterns by etching the substrate using the fin mask patterns and the guard mask patterns as etching masks, the fin patterns including active fin patterns and guard fin patterns;
    forming recess portions on the substrate by removing the guard fin patterns;
    forming a device isolation layer on the substrate, upper portions of the active fin patterns protruding from an upper surface of the device isolation layer; and
    forming gate structures on the device isolation layer, the gate structures intersecting the active fin patterns and extending in a second direction.

2. The method according to claim 1, wherein the removing the dummy mask patterns comprises:
    forming a first material layer covering a surface of the substrate and filling a region among the mask patterns; and
    forming a first photoresist pattern on the first material layer, the first photoresist pattern having a first opening.

3. The method according to claim 2, further comprises removing the dummy mask patterns and at least portion of the first material layer through the first opening.

4. The method according to claim 1, wherein by the forming the fin patterns,
    etching residues are deposited on sidewalls of the guard fin patterns.

5. The method according to claim 4, wherein the forming recess portions on the substrate by removing the guard fin patterns comprises:
    forming a second material layer covering a surface of the substrate and filling a region among the mask patterns; and
    forming a second photoresist pattern on the second material layer, the second photoresist pattern having a second opening.

6. The method according to claim 5, further comprises removing the guard fin patterns and at least portion of the second material layer through the second opening.

7. The method according to claim 6, wherein by removing the guard fin patterns,
    the etching residues is removed along with the guard fin patterns.

8. The method according to claim 1, wherein by the forming the recess portions,
    a planar portion is formed, the planar portion extending from the recess portion.

9. The method according to claim 8,
    wherein the active fin patterns extend in a first direction from the substrate and arranged with a first pitch in a second direction perpendicular to the first direction,
    wherein the recess portions have a central axis spaced apart by a first distance in the second direction from a central axis of a corresponding active fin pattern among the active fin patterns, and
    wherein the planar portion have a first width in the second direction.

10. The method according to claim 9,
    wherein the first pitch is a minimum pitch in the second direction of the active fin patterns, wherein the first distance is about 0.8 times to about 1.2 times the first pitch, and wherein the first width is greater than the first pitch.

11. The method according to claim 10, wherein each of the recess portions includes:
- double-humped protrusions protruding upwardly towards the upper surface of the device isolation layer; and
- a recessed concave portion between the double-humped protrusions.

12. The method according to claim 11, wherein
the double-humped protrusions include a first protrusion and a second protrusion,
the first protrusion is adjacent to the corresponding active fin pattern and has a first upper end,
the second protrusion is adjacent to the planar portion and has a second upper end,
the first upper end is spaced apart from the central axis of the corresponding active fin pattern by a first spacing in the second direction,
the second upper end is spaced apart from the central axis of the corresponding active fin pattern by a second spacing in the second direction,
the first spacing is about 0.5 times to about 0.8 times the first pitch, and
the second spacing is about 1.2 times to about 1.5 times the first pitch.

13. The method according to claim 10, wherein a lower end of the recess portion is in the substrate at a level lower than a surface of the planar portion.

14. The method according to claim 13, wherein the recess portion has a trench shape in the substrate that is concave downwardly without a sharp protrusion.

15. A method for manufacturing a semiconductor device comprising:
- sequentially forming a mask layer, a first sacrificial layer, and a second sacrificial layer on a substrate;
- forming second sacrificial patterns by etching the second sacrificial layer;
- forming first spacers on sidewalls of the second sacrificial patterns;
- selectively removing the second sacrificial patterns with respect to the first spacers;
- forming first sacrificial patterns by etching the first sacrificial layer using the first spacers as etching masks;
- forming second spacers on sidewalls of the first sacrificial patterns and spaced apart from each other by a first pitch in a first direction;
- selectively removing the first sacrificial patterns with respect to the second spacers;
- forming mask patterns by etching the mask layer using the second spacers as etching masks;
- removing at least one of the mask patterns;
- forming active fin patterns and guard fin patterns by etching the substrate using the mask patterns as etching masks;
- forming recess portions on the substrate by removing the guard fin patterns, each of the recess portions having a central axis spaced apart by a first distance in the first direction from a central axis of a corresponding active fin pattern among the active fin patterns;
- forming a device isolation layer on the substrate, upper portions of the active fin patterns protruding from an upper surface of the device isolation layer; and forming gate structures and source/drain regions on the substrate.

16. The method according to claim 15, wherein by the forming the recess portions, a planar portion is formed, the planar portion extending from the recess portions and having a first width in the first direction,
wherein the first pitch is a minimum pitch in the first direction of the active fin patterns,
wherein the first distance is about 0.8 times to about 1.2 times the first pitch, and
wherein the first width is greater than the first pitch.

17. The method according to claim 15, wherein the forming gate structures comprises:
- forming a plurality of channel layers spaced apart from each other in a second direction perpendicular to the first direction on each of the active fin patterns,
- wherein each of the plurality of channel layers are surrounded by a gate dielectric layer and a gate electrode of a corresponding gate structure among the gate structures.

18. A method for manufacturing a semiconductor device comprising:
- forming fin patterns including first fin patterns and second fin patterns on a substrate, the fin patterns extending in a first direction from the substrate, and the first fin patterns arranged with a first pitch in a second direction perpendicular to the first direction;
- forming recess portions including first recess portions and second recess portion, the first recess portions having a central axis spaced apart by a first distance in the second direction from a central axis of a corresponding first fin pattern among the first fin patterns;
- wherein by the forming the first recess portions, a planar portion is formed, the planar portion extending from the first recess portion and having a first width in the second direction,
- forming a device isolation layer on the substrate, upper portions of the fin patterns protruding from an upper surface of the device isolation layer; and
- forming gate structures on the device isolation layer, the gate structures intersecting the fin patterns and extending in the second direction,
- wherein the first pitch is a minimum pitch in the second direction of the first fin patterns,
- wherein the first distance is about 0.8 times to about 1.2 times the first pitch, and
- wherein the first width is greater than the first pitch.

19. The method according to claim 18,
wherein the second fin patterns arranged with a second pitch in a second direction perpendicular to the first direction, and
wherein the second pitch is greater than the first pitch.

20. The method according to claim 19,
wherein the second recess portions having a central axis spaced apart by a second distance in the second direction from a central axis of a corresponding second fin pattern among the second fin patterns;
wherein the second distance is smaller than the second pitch.

* * * * *